(12) United States Patent
Gorisse

(10) Patent No.: US 8,957,728 B2
(45) Date of Patent: Feb. 17, 2015

(54) COMBINED FILTER AND TRANSCONDUCTANCE AMPLIFIER

(71) Applicant: RF Micro Devices, Inc., Greensboro, NC (US)

(72) Inventor: Philippe Gorisse, Brax (FR)

(73) Assignee: RF Micro Devices, Inc., Greensboro, NC (US)

( * ) Notice: Subject to any disclaimer, the term of this patent is extended or adjusted under 35 U.S.C. 154(b) by 50 days.

(21) Appl. No.: 13/647,815

(22) Filed: Oct. 9, 2012

(65) Prior Publication Data

US 2013/0088291 A1    Apr. 11, 2013

Related U.S. Application Data

(60) Provisional application No. 61/544,051, filed on Oct. 6, 2011.

(51) Int. Cl.
    H03G 3/20    (2006.01)
    H03F 3/04    (2006.01)

(52) U.S. Cl.
    USPC ............................ 330/136; 330/306; 330/302

(58) Field of Classification Search
    USPC .......................................... 330/136, 306, 302
    IPC ............................. H03F 3/04,3/191; H03G 3/20
    See application file for complete search history.

(56) References Cited

U.S. PATENT DOCUMENTS

| | | | |
|---|---|---|---|
| 3,969,682 A * | 7/1976 | Rossum | 330/85 |
| 3,980,964 A * | 9/1976 | Grodinsky | 330/278 |
| 4,587,552 A | 5/1986 | Chin | |
| 4,692,889 A | 9/1987 | McNeely | |
| 4,831,258 A | 5/1989 | Paulk et al. | |
| 4,996,500 A | 2/1991 | Larson et al. | |
| 5,099,203 A | 3/1992 | Weaver et al. | |
| 5,146,504 A | 9/1992 | Pinckley | |
| 5,187,396 A | 2/1993 | Armstrong, II et al. | |
| 5,311,309 A | 5/1994 | Ersoz et al. | |
| 5,317,217 A * | 5/1994 | Rieger et al. | 327/555 |
| 5,351,087 A | 9/1994 | Christopher et al. | |
| 5,414,614 A | 5/1995 | Fette et al. | |
| 5,420,643 A | 5/1995 | Romesburg et al. | |
| 5,486,871 A | 1/1996 | Filliman et al. | |
| 5,532,916 A | 7/1996 | Tamagawa | |

(Continued)

FOREIGN PATENT DOCUMENTS

| | | |
|---|---|---|
| EP | 0755121 A2 | 1/1997 |
| EP | 1492227 A1 | 12/2004 |

(Continued)

OTHER PUBLICATIONS

International Preliminary Report on Patentability for PCT/US2012/024124, mailed Aug. 22, 2013, 8 pages.

(Continued)

*Primary Examiner* — Patricia Nguyen
(74) *Attorney, Agent, or Firm* — Withrow & Terranova, P.L.L.C.

(57) ABSTRACT

Embodiments of circuitry, which includes an operational transconductance amplifier and a passive circuit, are disclosed. The passive circuit is coupled to the operational transconductance amplifier. Further, the passive circuit receives an input signal and the operational transconductance amplifier provides an output current, such that the passive circuit and the OTA high-pass filter and integrate the input signal to provide the output signal.

17 Claims, 13 Drawing Sheets

(56) References Cited

U.S. PATENT DOCUMENTS

| | | | |
|---|---|---|---|
| 5,541,547 A | 7/1996 | Lam | |
| 5,581,454 A | 12/1996 | Collins | |
| 5,646,621 A | 7/1997 | Cabler et al. | |
| 5,715,526 A | 2/1998 | Weaver, Jr. et al. | |
| 5,767,744 A | 6/1998 | Irwin et al. | |
| 5,822,318 A | 10/1998 | Tiedemann, Jr. et al. | |
| 5,898,342 A | 4/1999 | Bell | |
| 5,905,407 A | 5/1999 | Midya | |
| 5,936,464 A | 8/1999 | Grondahl | |
| 6,043,610 A | 3/2000 | Buell | |
| 6,043,707 A | 3/2000 | Budnik | |
| 6,055,168 A | 4/2000 | Kotowski et al. | |
| 6,070,181 A | 5/2000 | Yeh | |
| 6,118,343 A | 9/2000 | Winslow | |
| 6,133,777 A | 10/2000 | Savelli | |
| 6,141,541 A | 10/2000 | Midya et al. | |
| 6,147,478 A | 11/2000 | Skelton et al. | |
| 6,198,645 B1 | 3/2001 | Kotowski et al. | |
| 6,204,731 B1 | 3/2001 | Jiang | |
| 6,256,482 B1 | 7/2001 | Raab | |
| 6,300,826 B1 | 10/2001 | Mathe et al. | |
| 6,313,681 B1 | 11/2001 | Yoshikawa | |
| 6,348,780 B1 | 2/2002 | Grant | |
| 6,483,281 B2 | 11/2002 | Hwang | |
| 6,559,689 B1 | 5/2003 | Clark | |
| 6,566,935 B1 | 5/2003 | Renous | |
| 6,583,610 B2 | 6/2003 | Groom et al. | |
| 6,617,930 B2 | 9/2003 | Nitta | |
| 6,621,808 B1 | 9/2003 | Sadri | |
| 6,624,712 B1 | 9/2003 | Cygan et al. | |
| 6,658,445 B1 | 12/2003 | Gau et al. | |
| 6,681,101 B1 | 1/2004 | Eidson et al. | |
| 6,690,652 B1 | 2/2004 | Sadri | |
| 6,701,141 B2 | 3/2004 | Lam | |
| 6,703,080 B2 | 3/2004 | Reyzelman et al. | |
| 6,728,163 B2 | 4/2004 | Gomm et al. | |
| 6,744,151 B2 | 6/2004 | Jackson et al. | |
| 6,819,938 B2 | 11/2004 | Sahota | |
| 6,958,596 B1 | 10/2005 | Sferrazza et al. | |
| 6,995,995 B2 | 2/2006 | Zeng et al. | |
| 7,038,536 B2 | 5/2006 | Cioffi et al. | |
| 7,043,213 B2 | 5/2006 | Robinson et al. | |
| 7,058,373 B2 | 6/2006 | Grigore | |
| 7,099,635 B2 | 8/2006 | McCune | |
| 7,164,893 B2 | 1/2007 | Leizerovich et al. | |
| 7,200,365 B2 | 4/2007 | Watanabe et al. | |
| 7,233,130 B1* | 6/2007 | Kay | 323/222 |
| 7,253,589 B1 | 8/2007 | Potanin et al. | |
| 7,254,157 B1 | 8/2007 | Crotty et al. | |
| 7,279,875 B2 | 10/2007 | Gan et al. | |
| 7,394,233 B1 | 7/2008 | Trayling et al. | |
| 7,405,618 B2 | 7/2008 | Lee et al. | |
| 7,411,316 B2 | 8/2008 | Pai | |
| 7,414,330 B2 | 8/2008 | Chen | |
| 7,515,885 B2 | 4/2009 | Sander et al. | |
| 7,528,807 B2 | 5/2009 | Kim et al. | |
| 7,529,523 B1 | 5/2009 | Young et al. | |
| 7,539,466 B2 | 5/2009 | Tan et al. | |
| 7,595,569 B2 | 9/2009 | Amerom et al. | |
| 7,609,114 B2 | 10/2009 | Hsieh et al. | |
| 7,615,979 B2 | 11/2009 | Caldwell | |
| 7,627,622 B2 | 12/2009 | Conrad et al. | |
| 7,646,108 B2 | 1/2010 | Paillet et al. | |
| 7,653,366 B2 | 1/2010 | Grigore | |
| 7,679,433 B1 | 3/2010 | Li | |
| 7,684,216 B2 | 3/2010 | Choi et al. | |
| 7,696,735 B2 | 4/2010 | Oraw et al. | |
| 7,715,811 B2 | 5/2010 | Kenington | |
| 7,724,837 B2 | 5/2010 | Filimonov et al. | |
| 7,773,691 B2 | 8/2010 | Khlat et al. | |
| 7,777,459 B2 | 8/2010 | Williams | |
| 7,782,036 B1 | 8/2010 | Wong et al. | |
| 7,783,269 B2 | 8/2010 | Vinayak et al. | |
| 7,800,427 B2* | 9/2010 | Chae et al. | 327/337 |
| 7,805,115 B1 | 9/2010 | McMorrow et al. | |
| 7,859,336 B2 | 12/2010 | Markowski et al. | |
| 7,880,547 B2 | 2/2011 | Lee et al. | |
| 7,894,216 B2 | 2/2011 | Melanson | |
| 7,898,268 B2 | 3/2011 | Bernardon et al. | |
| 7,898,327 B2 | 3/2011 | Nentwig | |
| 7,907,010 B2 | 3/2011 | Wendt et al. | |
| 7,915,961 B1 | 3/2011 | Li | |
| 7,923,974 B2 | 4/2011 | Martin et al. | |
| 7,965,140 B2 | 6/2011 | Takahashi | |
| 7,994,864 B2 | 8/2011 | Chen et al. | |
| 8,000,117 B2 | 8/2011 | Petricek | |
| 8,008,970 B1 | 8/2011 | Homol et al. | |
| 8,022,761 B2 | 9/2011 | Drogi et al. | |
| 8,026,765 B2 | 9/2011 | Giovannotto | |
| 8,044,639 B2 | 10/2011 | Tamegai et al. | |
| 8,068,622 B2 | 11/2011 | Melanson et al. | |
| 8,081,199 B2 | 12/2011 | Takata et al. | |
| 8,093,951 B1 | 1/2012 | Zhang et al. | |
| 8,159,297 B2 | 4/2012 | Kumagai | |
| 8,164,388 B2 | 4/2012 | Iwamatsu | |
| 8,174,313 B2 | 5/2012 | Vice | |
| 8,183,917 B2 | 5/2012 | Drogi et al. | |
| 8,183,929 B2 | 5/2012 | Grondahl | |
| 8,198,941 B2 | 6/2012 | Lesso | |
| 8,204,456 B2 | 6/2012 | Xu et al. | |
| 8,242,813 B1 | 8/2012 | Wile et al. | |
| 8,274,332 B2 | 9/2012 | Cho et al. | |
| 8,289,084 B2 | 10/2012 | Morimoto et al. | |
| 8,362,837 B2 | 1/2013 | Koren et al. | |
| 8,541,993 B2 | 9/2013 | Notman et al. | |
| 8,542,061 B2 | 9/2013 | Levesque et al. | |
| 8,548,398 B2 | 10/2013 | Baxter et al. | |
| 8,558,616 B2 | 10/2013 | Shizawa et al. | |
| 8,588,713 B2 | 11/2013 | Khlat | |
| 8,611,402 B2 | 12/2013 | Chiron | |
| 8,618,868 B2 | 12/2013 | Khlat et al. | |
| 8,624,576 B2 | 1/2014 | Khlat et al. | |
| 8,624,760 B2 | 1/2014 | Ngo et al. | |
| 8,626,091 B2 | 1/2014 | Khlat et al. | |
| 8,638,165 B2* | 1/2014 | Shah et al. | 330/9 |
| 8,648,657 B1 | 2/2014 | Rozenblit | |
| 8,659,355 B2 | 2/2014 | Henshaw et al. | |
| 8,718,582 B2 | 5/2014 | See et al. | |
| 2002/0071497 A1 | 6/2002 | Bengtsson et al. | |
| 2003/0031271 A1 | 2/2003 | Bozeki et al. | |
| 2003/0062950 A1 | 4/2003 | Hamada et al. | |
| 2003/0137286 A1 | 7/2003 | Kimball et al. | |
| 2003/0198063 A1 | 10/2003 | Smyth | |
| 2003/0206603 A1 | 11/2003 | Husted | |
| 2003/0220953 A1 | 11/2003 | Allred | |
| 2003/0232622 A1 | 12/2003 | Seo et al. | |
| 2004/0047329 A1 | 3/2004 | Zheng | |
| 2004/0051384 A1 | 3/2004 | Jackson et al. | |
| 2004/0124913 A1 | 7/2004 | Midya et al. | |
| 2004/0184569 A1 | 9/2004 | Challa et al. | |
| 2004/0196095 A1 | 10/2004 | Nonaka | |
| 2004/0219891 A1 | 11/2004 | Hadjichristos | |
| 2004/0239301 A1 | 12/2004 | Kobayashi | |
| 2004/0266366 A1 | 12/2004 | Robinson et al. | |
| 2004/0267842 A1 | 12/2004 | Allred | |
| 2005/0008093 A1 | 1/2005 | Matsuura et al. | |
| 2005/0032499 A1 | 2/2005 | Cho | |
| 2005/0047180 A1 | 3/2005 | Kim | |
| 2005/0064830 A1 | 3/2005 | Grigore | |
| 2005/0093630 A1 | 5/2005 | Whittaker et al. | |
| 2005/0110562 A1 | 5/2005 | Robinson et al. | |
| 2005/0122171 A1 | 6/2005 | Miki et al. | |
| 2005/0156582 A1 | 7/2005 | Redl et al. | |
| 2005/0156662 A1 | 7/2005 | Raghupathy et al. | |
| 2005/0157778 A1 | 7/2005 | Trachewsky et al. | |
| 2005/0200407 A1 | 9/2005 | Arai et al. | |
| 2005/0286616 A1 | 12/2005 | Kodavati | |
| 2006/0006946 A1 | 1/2006 | Burns et al. | |
| 2006/0062324 A1 | 3/2006 | Naito et al. | |
| 2006/0097711 A1 | 5/2006 | Brandt | |
| 2006/0128324 A1 | 6/2006 | Tan et al. | |
| 2006/0178119 A1 | 8/2006 | Jarvinen | |
| 2006/0181340 A1 | 8/2006 | Dhuyvetter | |
| 2006/0220627 A1 | 10/2006 | Koh | |

(56) References Cited

U.S. PATENT DOCUMENTS

| | | |
|---|---|---|
| 2006/0244513 A1 | 11/2006 | Yen et al. |
| 2007/0008804 A1 | 1/2007 | Lu et al. |
| 2007/0014382 A1 | 1/2007 | Shakeshaft et al. |
| 2007/0024360 A1 | 2/2007 | Markowski |
| 2007/0063681 A1 | 3/2007 | Liu |
| 2007/0082622 A1 | 4/2007 | Leinonen et al. |
| 2007/0146076 A1 | 6/2007 | Baba |
| 2007/0182392 A1 | 8/2007 | Nishida |
| 2007/0183532 A1 | 8/2007 | Matero |
| 2007/0259628 A1 | 11/2007 | Carmel et al. |
| 2008/0003950 A1 | 1/2008 | Haapoja et al. |
| 2008/0044041 A1 | 2/2008 | Tucker et al. |
| 2008/0081572 A1 | 4/2008 | Rofougaran |
| 2008/0104432 A1 | 5/2008 | Vinayak et al. |
| 2008/0150619 A1 | 6/2008 | Lesso et al. |
| 2008/0205095 A1 | 8/2008 | Pinon et al. |
| 2008/0242246 A1 | 10/2008 | Minnis et al. |
| 2008/0252278 A1 | 10/2008 | Lindeberg et al. |
| 2008/0258831 A1 | 10/2008 | Kunihiro et al. |
| 2008/0280577 A1 | 11/2008 | Beukema et al. |
| 2009/0004981 A1 | 1/2009 | Eliezer et al. |
| 2009/0097591 A1 | 4/2009 | Kim |
| 2009/0160548 A1 | 6/2009 | Ishikawa et al. |
| 2009/0167260 A1 | 7/2009 | Pauritsch et al. |
| 2009/0174466 A1 | 7/2009 | Hsieh et al. |
| 2009/0184764 A1 | 7/2009 | Markowski et al. |
| 2009/0190699 A1 | 7/2009 | Kazakevich et al. |
| 2009/0218995 A1 | 9/2009 | Ahn |
| 2009/0230934 A1 | 9/2009 | Hooijschuur et al. |
| 2009/0261908 A1 | 10/2009 | Markowski |
| 2009/0284235 A1 | 11/2009 | Weng et al. |
| 2009/0289720 A1 | 11/2009 | Takinami et al. |
| 2009/0319065 A1 | 12/2009 | Risbo |
| 2010/0001793 A1 | 1/2010 | Van Zeijl et al. |
| 2010/0019749 A1 | 1/2010 | Katsuya et al. |
| 2010/0019840 A1 | 1/2010 | Takahashi |
| 2010/0026250 A1 | 2/2010 | Petty |
| 2010/0045247 A1 | 2/2010 | Blanken et al. |
| 2010/0171553 A1 | 7/2010 | Okubo et al. |
| 2010/0253309 A1 | 10/2010 | Xi et al. |
| 2010/0266066 A1 | 10/2010 | Takahashi |
| 2010/0301947 A1 | 12/2010 | Fujioka et al. |
| 2010/0308654 A1 | 12/2010 | Chen |
| 2010/0311365 A1 | 12/2010 | Vinayak et al. |
| 2010/0321127 A1 | 12/2010 | Watanabe et al. |
| 2010/0327825 A1 | 12/2010 | Mehas et al. |
| 2011/0018626 A1 | 1/2011 | Kojima |
| 2011/0058601 A1 | 3/2011 | Kim et al. |
| 2011/0084760 A1 | 4/2011 | Guo et al. |
| 2011/0148375 A1 | 6/2011 | Tsuji |
| 2011/0234182 A1 | 9/2011 | Wilson |
| 2011/0235827 A1 | 9/2011 | Lesso et al. |
| 2011/0279180 A1 | 11/2011 | Yamanouchi et al. |
| 2011/0298539 A1 | 12/2011 | Drogi et al. |
| 2012/0025907 A1 | 2/2012 | Koo et al. |
| 2012/0025919 A1 | 2/2012 | Huynh |
| 2012/0034893 A1 | 2/2012 | Baxter et al. |
| 2012/0049953 A1 | 3/2012 | Khlat |
| 2012/0068767 A1 | 3/2012 | Henshaw et al. |
| 2012/0074916 A1 | 3/2012 | Trochut |
| 2012/0133299 A1 | 5/2012 | Capodivacca et al. |
| 2012/0139516 A1 | 6/2012 | Tsai et al. |
| 2012/0154035 A1 | 6/2012 | Hongo et al. |
| 2012/0154054 A1 | 6/2012 | Kaczman et al. |
| 2012/0170334 A1 | 7/2012 | Menegoli et al. |
| 2012/0176196 A1 | 7/2012 | Khlat |
| 2012/0194274 A1 | 8/2012 | Fowers et al. |
| 2012/0200354 A1 | 8/2012 | Ripley et al. |
| 2012/0236444 A1 | 9/2012 | Srivastava et al. |
| 2012/0244916 A1 | 9/2012 | Brown et al. |
| 2012/0299647 A1 | 11/2012 | Honjo et al. |
| 2013/0034139 A1 | 2/2013 | Khlat et al. |
| 2013/0094553 A1 | 4/2013 | Paek et al. |
| 2013/0169245 A1 | 7/2013 | Kay et al. |
| 2013/0214858 A1 | 8/2013 | Tournatory et al. |
| 2013/0229235 A1 | 9/2013 | Ohnishi |
| 2013/0307617 A1 | 11/2013 | Khlat et al. |
| 2013/0328613 A1 | 12/2013 | Kay et al. |
| 2014/0009200 A1 | 1/2014 | Kay et al. |
| 2014/0009227 A1 | 1/2014 | Kay et al. |

FOREIGN PATENT DOCUMENTS

| | | |
|---|---|---|
| EP | 1569330 A1 | 8/2005 |
| EP | 2214304 A1 | 8/2010 |
| EP | 2244366 A1 | 10/2010 |
| EP | 2372904 A1 | 10/2011 |
| GB | 2462204 A | 2/2010 |
| GB | 2465552 A | 5/2010 |
| GB | 2484475 A | 4/2012 |
| WO | 0048306 A1 | 8/2000 |
| WO | 04002006 A1 | 12/2003 |
| WO | 2004082135 A2 | 9/2004 |
| WO | 2005013084 A2 | 2/2005 |
| WO | 2006021774 A1 | 3/2006 |
| WO | 2006070319 A1 | 7/2006 |
| WO | 2006073208 A1 | 7/2006 |
| WO | 2007107919 A1 | 9/2007 |
| WO | 2007149346 A2 | 12/2007 |
| WO | 2012151594 A2 | 11/2012 |
| WO | 2012172544 A1 | 12/2012 |

OTHER PUBLICATIONS

International Preliminary Report on Patentability for PCT/US2012/023495, mailed Aug. 15, 2013, 10 pages.

Wu, Patrick Y. et al., "A Two-Phase Switching Hybrid Supply Modulator for RF Power Amplifiers with 9% Efficiency Improvement," IEEE Journal of Solid-State Circuits, vol. 45, No. 12, Dec. 2010, pp. 2543-2556.

Yousefzadeh, Vahid et al., "Band Separation and Efficiency Optimization in Linear-Assisted Switching Power Amplifiers," 37th IEEE Power Electronics Specialists Conference, Jun. 18-22, 2006, pp. 1-7.

International Preliminary Report on Patentability for PCT/US2012/040317, mailed Dec. 12, 2013, 5 pages.

Notice of Allowance for U.S. Appl. No. 13/531,719, mailed Dec. 30, 2013, 7 pages.

Non-Final Office Action for U.S. Appl. No. 14/022,940, mailed Dec. 20, 2013, 5 pages.

International Search Report and Written Opinion for PCT/US2013/052277, mailed Jan. 7, 2014, 14 pages.

Non-Final Office Action for U.S. Appl. No. 13/188,024, mailed Feb. 5, 2013, 8 pages.

Notice of Allowance for U.S. Appl. No. 13/188,024, mailed Jun. 18, 2013, 7 pages.

International Preliminary Report on Patentability for PCT/US2011/044857 mailed Mar. 7, 2013, 6 pages.

Notice of Allowance for U.S. Appl. No. 13/218,400 mailed Apr. 11, 2013, 7 pages.

International Search Report for PCT/US2011/054106 mailed Feb. 9, 2012, 11 pages.

International Preliminary Report on Patentability for PCT/US2011/054106 mailed Apr. 11, 2013, 8 pages.

International Preliminary Report on Patentability for PCT/US2011/061007 mailed May 30, 2013, 11 pages.

Non-Final Office Action for U.S. Appl. No. 13/297,470 mailed May 8, 2013, 15 pages.

International Preliminary Report on Patentability for PCT/US2011/061009 mailed May 30, 2013, 10 pages.

Notice of Allowance for U.S. Appl. No. 13/222,453 mailed Feb. 21, 2013, 7 pages.

Non-Final Office Action for U.S. Appl. No. 13/423,649, mailed May 22, 2013, 7 pages.

International Search Report for PCT/US2012/40317 mailed Sep. 7, 2012, 7 pages.

International Search Report for PCT/US2012/046887 mailed Dec. 21, 2012, 12 pages.

Final Office Action for U.S. Appl. No. 13/222,484 mailed Apr. 10, 2013, 10 pages.

(56) References Cited

OTHER PUBLICATIONS

Advisory Action for U.S. Appl. No. 13/222,484, mailed Jun. 14, 2013, 3 pages.
International Search Report and Written Opinion for PCT/US2012/053654 mailed Feb. 15, 2013, 11 pages.
International Search Report and Written Opinion for PCT/US2012/062070, mailed Jan. 21, 2013, 12 pages.
International Search Report and Written Opinion for PCT/US2012/067230 mailed Feb. 21, 2013, 10 pages.
International Preliminary Report on Patentability for PCT/US2011/064255, mailed Jun. 20, 2013, 7 pages.
Notice of Allowance for U.S. Appl. No. 13/343,840, mailed Jul. 1, 2013, 8 pages.
Dixon, N., "Standardisation boosts momentum for Envelope tracking," Microwave Engineers, Europe, Apr. 20, 2011, 2 pages.
Choi, J. et al., "A New Power Management IC Architecture for Envelope Tracking Power Amplifier," IEEE Transactions on Microwave Theory and Techniques, vol. 59, No. 7, Jul. 2011, pp. 1796-1802.
Kim, N. et al, "Ripple feedback filter suitable for analog/digital mixed-mode audio amplifier for improved efficiency and stability," 33rd Annual Power Electronics Specialists Conference, vol. 1, Jun. 23, 2002, pp. 45-49.
Kim et al., "High Efficiency and Wideband Envelope Tracking Power Amplifier with Sweet Spot Tracking," 2010 IEEE Radio Frequency Integrated Circuits Symposium, May 23-25, 2010, pp. 255-258.
Knutson, P, et al., "An Optimal Approach to Digital Raster Mapper Design," 1991 IEEE Transactions on Consumer Electronics held Jun. 5-7, 1991, vol. 37, Issue 4, published Nov. 1991, pp. 746-752.
Le, Hanh-Phuc et al., "A 32nm Fully Integrated Reconfigurable Switched-Capacitor DC-DC Convertor Delivering 0.55W/mm2 at 81% Efficiency," 2010 IEEE International Solid State Circuits Conference, Feb. 7-11, 2010, pp. 210-212.
Sahu, B. et al., "Adaptive Power Management of Linear RF Power Amplifiers in Mobile Handsets—An Integrated System Design Approach," submission for IEEE Asia Pacific Microwave Conference, Mar. 2004, 4 pages.
Unknown, "Nujira files 100th envelope tracking patent," CS: Compound Semiconductor, Apr. 11, 2011, 1 page.
Non-final Office Action for U.S. Appl. No. 12/112,006 mailed Apr. 5, 2010, now Patent No. 7,884,681, 6 pages.
Notice of Allowance for U.S. Appl. No. 12/112,006 now Patent No. 7,884,681, mailed Jul. 19, 2010, 6 pages.
International Search Report for PCT/US11/033037 mailed Aug. 9, 2011, 10 pages.
International Search Report for PCT/US2011/044857 mailed Oct. 24, 2011, 10 pages.
International Search Report for PCT/US11/49243 mailed Dec. 22, 2011, 9 pages.
International Search Report for PCT/US2011/064255 mailed Apr. 3, 2012, 12 pages.
Non-final Office Action for U.S. Appl. No. 11/113,873, now Patent No. 7,773,691 mailed Feb. 1, 2008, 17 pages.
Final Office Action for U.S. Appl. No. 11/113,873, now Patent No. 7,773,691, mailed Jul. 30, 2008, 19 pages.
Non-final Office Action for U.S. Appl. No. 11/113,873, now Patent No. 7,773,691, mailed Nov. 26, 2008, 22 pages.
Final Office Action for U.S. Appl. No. 11/113,873, now Patent No. 7,773,691, mailed May 4, 2009, 20 pages.
Non-final Office Action for U.S. Appl. No. 11/113,873, now Patent No. 7,773,691, mailed Feb. 3, 2010, 21 pages.
Notice of Allowance for U.S. Appl. No. 11/113,873, now Patent No. 7,773,691, mailed Jun. 9, 2010, 7 pages.
International Search Report for PCT/US06/12619 mailed May 8, 2007, 2 pages.
Extended European Search Report for application 06740532.4 mailed Dec. 7, 2010, 7 pages.
International Search Report for PCT/US2011/061009 mailed Feb. 8, 2012, 14 pages.
International Search Report for PCT/US2012/023495 mailed May 7, 2012, 13 pages.
Invitation to Pay Additional Fees and Where Applicable Protest Fee for PCT/US2011/061007 mailed Feb. 13, 2012, 7 pages.
Hekkala, A. et al., "Adaptive time misalignment compensation in envelope tracking amplifiers," International Symposium on Spread Spectrum Techniques and Applications, Aug. 2008, pp. 761-765.
Invitation to Pay Additional Fees and Where Applicable Protest Fee for PCT/US2012/024124 mailed Jun. 1, 2012, 7 pages.
Li et al., "A highly efficient SiGe differential power amplifier using an envelope-tracking technique for 3GPP LTE applications," IEEE Bipolar/BiCMOS Circuits and Technology Meeting (BCTM), Oct. 4-6, 2010, pp. 121-124.
Cidronali, A. et al., "A 240W dual-band 870 and 2140 MHz envelope tracking GaN PA designed by a probability distribution conscious approach," IEEE MTT-S International Microwave Symposium Digest, Jun. 5-10, 2011, 4 pages.
International Search Report for PCT/US2011/061007 mailed Aug. 16, 2012, 16 pages.
International Search Report for PCT/US2012/024124 mailed Aug. 24, 2012, 14 pages.
Non-final Office Action for U.S. Appl. No. 13/218,400 mailed Nov. 8, 2012, 7 pages.
Notice of Allowance for U.S. Appl. No. 13/316,229 mailed Nov. 14, 2012, 9 pages.
Non-final Office Action for U.S. Appl. No. 13/222,484 mailed Nov. 8, 2012, 9 pages.
International Preliminary Report on Patentability for PCT/US11/49243 mailed Nov. 13, 2012, 33 pages.
Non-final Office Action for U.S. Appl. No. 13/089,917 mailed Nov. 23, 2012, 6 pages.
International Preliminary Report on Patentability for PCT/US2011/033037 mailed Oct. 23, 2012, 7 pages.
Non final Office Action for U.S. Appl. No. 13/222,453 mailed Dec. 6, 2012, 13 pages.
Final Office Action for U.S. Appl. No. 13/297,470, mailed Oct. 25, 2013, 17 pages.
Notice of Allowance for U.S. Appl. No. 14/022,858, mailed Oct. 25, 2013, 9 pages.
Non-Final Office Action for U.S. Appl. No. 13/550,049, mailed Nov. 25, 2013, 6 pages.
Non-Final Office Action for U.S. Appl. No. 12/836,307, mailed Nov. 5, 2013, 6 pages.
Examination Report for European Patent Application No. 11720630, mailed Aug. 16, 2013, 5 pages.
Lie, Donald Y.C. et al., "Design of Highly-Efficient Wideband RF Polar Transmitters Using Envelope-Tracking (ET) for Mobile WiMAX/Wibro Applications," IEEE 8th International Conference on ASIC (ASCION), Oct. 20-23, 2009, pp. 347-350.
Lie, Donald Y.C. et al., "Highly Efficient and Linear Class E SiGe Power Amplifier Design," 8th International Conference on Solid-State and Integrated Circuit Technology (ICSICT), Oct. 23-26, 2006, pp. 1526-1529.
Notice of Allowance for U.S. Appl. No. 13/363,888, mailed Jul. 18, 2013, 9 pages.
Notice of Allowance for U.S. Appl. No. 13/222,453, mailed Aug. 22, 2013, 8 pages.
Non-Final Office Action for U.S. Appl. No. 13/367,973, mailed Sep. 24, 2013, 8 pages.
Notice of Allowance for U.S. Appl. No. 13/423,649, mailed Aug. 30, 2013, 8 pages.
Notice of Allowance for U.S. Appl. No. 13/316,229, mailed Aug. 29, 2013, 8 pages.
Quayle Action for U.S. Appl. No. 13/531,719, mailed Oct. 10, 2013, 5 pages.
Notice of Allowance for U.S. Appl. No. 13/550,060, mailed Aug. 16, 2013, 8 pages.
Notice of Allowance for U.S. Appl. No. 13/222,484, mailed Aug. 26, 2013, 8 pages.
Notice of Allowance for U.S. Appl. No. 13/602,856, mailed Sep. 24, 2013, 9 pages.
Hassan, Muhammad, et al., "A Combined Series-Parallel Hybrid Envelope Amplifier for Envelope Tracking Mobile Terminal RF

(56) References Cited

OTHER PUBLICATIONS

Power Amplifier Applications," IEEE Journal of Solid-State Circuits, vol. 47, No. 5, May 1, 2012, pp. 1185-1198.

Hoversten, John, et al., "Codesign of PA, Supply, and Signal Processing for Linear Supply-Modulated RF Transmitters," IEEE Transactions on Microwave Theory and Techniques, vol. 60, No. 6, Jun. 2012, pp. 2010-2020.

Notice of Allowance for U.S. Appl. No. 12/836,307 mailed May 5, 2014, 6 pages.

Notice of Allowance for U.S. Appl. No. 13/297,490, mailed Feb. 27, 2014, 7 pages.

Non-Final Office Action for U.S. Appl. No. 13/297,470, mailed Feb. 20, 2014, 16 pages.

Notice of Allowance for U.S. Appl. No. 14/022,858 mailed May 27, 2014, 6 pages.

Non-Final Office Action for U.S. Appl. No. 13/367,973 mailed Apr. 25, 2014, 5 pages.

Non-Final Office Action for U.S. Appl. No. 13/486,012, mailed Jul. 28, 2014, 7 pages.

Notice of Allowance for U.S. Appl. No. 13/550,049, mailed Mar. 6, 2014, 5 pages.

International Preliminary Report on Patentability for PCT/US2012/046887, mailed Jan. 30, 2014, 8 pages.

International Preliminary Report on Patentability for PCT/US2012/053654, mailed Mar. 13, 2014, 7 pages.

Non-Final Office Action for U.S. Appl. No. 13/689,883 mailed Mar. 27, 2014, 13 pages.

International Preliminary Report on Patentability for PCT/US2012/062070 mailed May 8, 2014, 8 pages.

Non-Final Office Action for U.S. Appl. No. 13/661,552, mailed Feb. 21, 2014, 5 pages.

Notice of Allowance for U.S. Appl. No. 13/661,552, mailed Jun. 13, 2014, 5 pages.

International Search Report and Written Opinion for PCT/US2012/062110 issued Apr. 8, 2014, 12 pages.

International Preliminary Report on Patentability for PCT/US2012/062110 mailed May 8, 2014, 9 pages.

Non-Final Office Action for U.S. Appl. No. 13/692,084 mailed Apr. 10, 2014, 6 pages.

Notice of Allowance for U.S. Appl. No. 13/692,084, mailed Jul. 23, 2014, 7 pages.

International Preliminary Report on Patentability and Written Opinion for PCT/US2012/067230, mailed Jun. 12, 2014, 7 pages.

Non-Final Office Action for U.S. Appl. No. 13/684,826 mailed Apr. 3, 2014, 5 pages.

Notice of Allowance for U.S. Appl. No. 13/684,826, mailed Jul. 18, 2014, 7 pages.

Notice of Allowance for U.S. Appl. No. 14/022,940, mailed Jun. 10, 2014, 7 pages.

Non-Final Office Action for U.S. Appl. No. 13/714,600, mailed May 9, 2014, 14 pages.

Non-Final Office Action for U.S. Appl. No. 13/951,976 mailed Apr. 4, 2014, 7 pages.

International Search Report and Written Opinion for PCT/US2013/065403, mailed Feb. 5, 2014, 11 pages.

International Search Report and Written Opinion for PCT/US2014/028089, mailed Jul. 17, 2014, 10 pages.

Examination Report for European Patent Application No. 11720630.0 issued Mar. 18, 2014, 4 pages.

Notice of Allowance for U.S. Appl. No. 14/072,140, mailed Aug. 27, 2014, 8 pages.

Non-Final Office Action for U.S. Appl. No. 14/072,225, mailed Aug. 15, 2014, 4 pages.

Notice of Allowance for U.S. Appl. No. 13/548,283, mailed Sep. 3, 2014, 7 pages.

Non-Final Office Action for U.S. Appl. No. 13/689,883, mailed Aug. 27, 2014, 12 pages.

Notice of Allowance for U.S. Appl. No. 13/690,187, mailed Sep. 3, 2014, 9 pages.

Non-Final Office Action for U.S. Appl. No. 13/782,142, mailed Sep. 4, 2014, 6 pages.

European Search Report for Patent Application No. 14162682.0, issued Aug. 27, 2014, 7 pages.

Invitation to Pay Additional Fees and Partial International Search Report for PCT/US2014/028178, mailed Jul. 24, 2014, 7 pages.

Notice of Allowance for U.S. Appl. No. 14/072,140, mailed Dec. 2, 2014, 8 pages.

Notice of Allowance for U.S. Appl. No. 13/486,012, mailed Nov. 21, 2014, 8 pages.

Non-Final Office Action for U.S. Appl. No. 13/747,749, mailed Nov. 12, 2014, 32 pages.

Extended European Search Report for European Patent Application No. 12794149.0, issued Oct. 29, 2014, 6 pages.

International Search Report and Written Opinion for PCT/US2014/012927, mailed Sep. 30, 2014, 11 pages.

International Search Report and Written Opinion for PCT/US2014/028178, mailed Sep. 30, 2014, 17 pages.

Non-Final Office Action for U.S. Appl. No. 12/836,307, mailed Sep. 25, 2014, 5 pages.

Advisory Action for U.S. Appl. No. 13/297,470, mailed Sep. 19, 2014, 3 pages.

Non-Final Office Action for U.S. Appl. No. 13/297,470, mailed Oct. 20, 2014, 22 pages.

Notice of Allowance for U.S. Appl. No. 13/367,973, mailed Sep. 15, 2014, 7 pages.

Non-Final Office Action for U.S. Appl. No. 13/661,227, mailed Sep. 29, 2014, 24 pages.

Notice of Allowance for U.S. Appl. No. 13/684,826, mailed Sep. 8, 2014, 6 pages.

Non-Final Office Action for U.S. Appl. No. 13/714,600, mailed Oct. 15, 2014, 13 pages.

Notice of Allowance for U.S. Appl. No. 13/914,888, mailed Oct. 17, 2014, 10 pages.

Non-Final Office Action for U.S. Appl. No. 13/747,725, mailed Oct. 7, 2014, 6 pages.

\* cited by examiner

COMBINED FILTER AND TRANSCONDUCTANCE AMPLIFIER

RELATED APPLICATIONS

This application claims the benefit of U.S. provisional patent application No. 61/544,051, filed Oct. 6, 2011, the disclosure of which is incorporated herein by reference in its entirety.

FIELD OF THE DISCLOSURE

The present disclosure relates to operational transconductance amplifiers (OTAs) and circuits that incorporate OTAs.

BACKGROUND

FIG. 1A shows a prior art operational transconductance amplifier (OTA) 10 according to the prior art. The prior art OTA 10 receives a positive-side input voltage VP at a non-inverting input to the prior art OTA 10. Further, the prior art OTA 10 receives a negative-side input voltage VN at an inverting input to the prior art OTA 10. The prior art OTA 10 provides an output current IO based on a voltage difference between the positive-side input voltage VP and the negative-side input voltage VN. Specifically, the voltage difference is equal to a magnitude of the positive-side input voltage VP minus a magnitude of the negative-side input voltage VN. In this regard, since the prior art OTA 10 provides the output current IO based on the voltage difference, the prior art OTA 10 functions as a transconductance amplifier. As such, a transconductance GM of the prior art OTA 10 is equal to a magnitude of the output current IO divided by the voltage difference. Additionally, the prior art OTA 10 receives a first DC source signal DC1 and a second DC source signal DC2 to provide power to the prior art OTA 10.

FIG. 1B shows the prior art OTA 10 and a prior art OTA load circuit 12 according to the prior art. The prior art OTA load circuit 12 is coupled between an output from the prior art OTA 10 and a ground. The prior art OTA load circuit 12 has a load impedance ZL. The prior art OTA load circuit 12 receives the output current IO, such that an output voltage VO from the prior art OTA 10 is developed across the prior art OTA load circuit 12. In this regard, a magnitude of the output voltage VO is equal to the magnitude of the output current IO times a magnitude of the load impedance ZL. Since the prior art OTA 10 is an operational amplifier, the prior art OTA 10 may have very high input impedances and an open-circuit transconductance of the prior art OTA 10 may be very high. Therefore, the prior art OTA 10 may combine the functionality of an operational amplifier with transconductance characteristics, which may be useful in certain applications.

SUMMARY

Embodiments of the present disclosure relate to circuitry, which includes an operational transconductance amplifier (OTA) and a passive circuit. The passive circuit is coupled to the OTA. Further, the passive circuit receives an input signal and the OTA provides an output current, such that the passive circuit and the OTA high-pass filter and integrate the input signal to provide the output current.

In one embodiment of the OTA, the OTA and the passive circuit provide a combined filter and OTA. Further, the OTA is a single OTA. By combining high-pass filter, integrator, and transconductance functions using a single OTA, the combined filter and OTA may operate with a higher bandwidth than if multiple OTAs were used. As a result, for a given process technology, a bandwidth of the combined filter and OTA may be maximized, thereby maximizing an allowable bandwidth of the input signal.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Figure 1A:
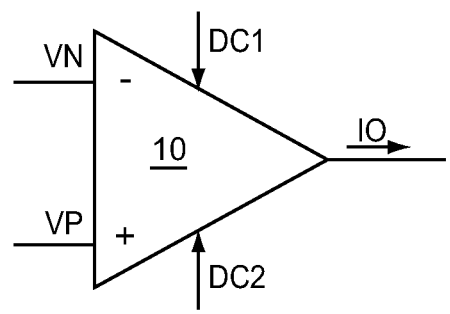
FIG. 1A shows a prior art operational transconductance amplifier (OTA) according to the prior art.
Figure 1B:
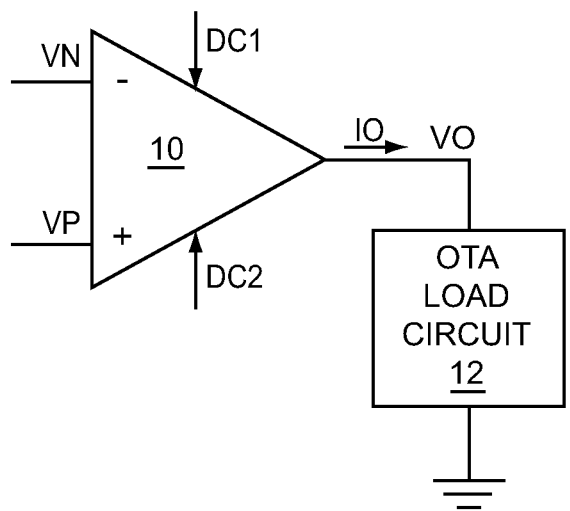
FIG. 1B shows the prior art OTA and a prior art OTA load circuit according to the prior art.
Figure 2:
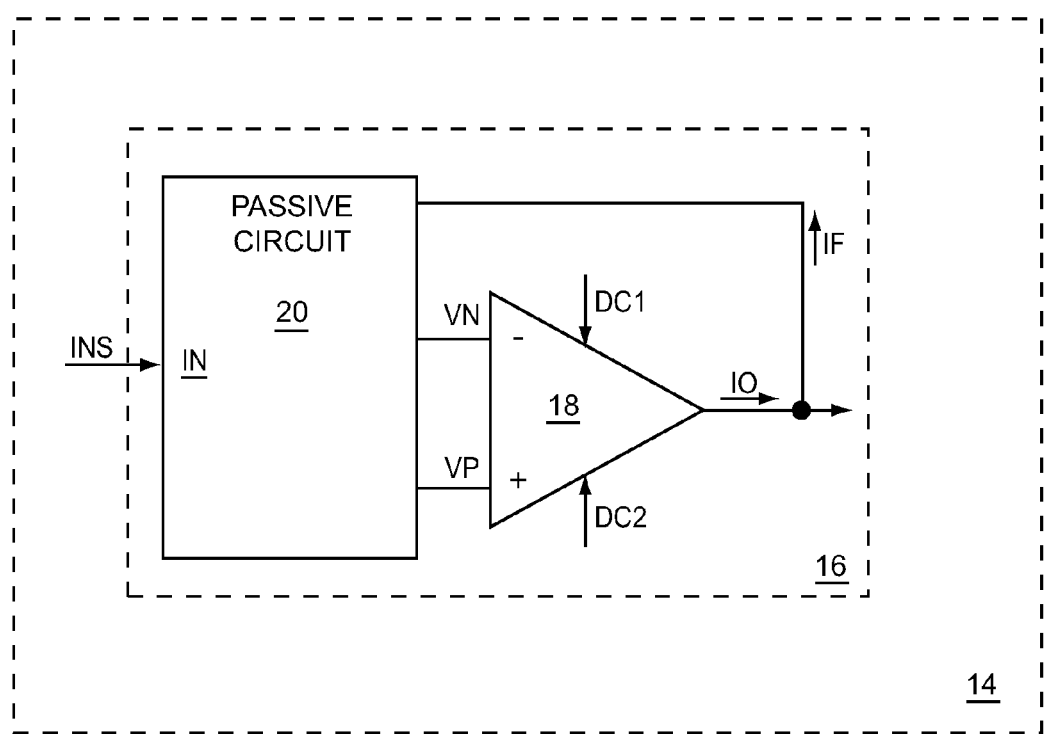
FIG. 2 shows details of circuitry according to one embodiment of the circuitry.

FIG. 2 shows details of circuitry 14 according to one embodiment of the circuitry 14. The circuitry 14 includes a combined filter and operational transconductance amplifier (OTA) 16, which includes an OTA 18 and a passive circuit 20. As such, the OTA 18 and the passive circuit 20 provide the combined filter and OTA 16. The OTA 18 is coupled to the passive circuit 20. Specifically, an inverting input to the OTA 18, a non-inverting input to the OTA 18, and an output from the OTA 18 are coupled to the passive circuit 20. The passive circuit 20 receives an input signal INS via an input IN and the OTA 18 provides an output current IO, such that the passive circuit 20 and the OTA 18 high-pass filter and integrate the input signal INS to provide the output current IO. A portion of the output current IO is fed back to the passive circuit 20. A feedback current IF is the portion of the output current IO that is fed back to the passive circuit 20. In one embodiment of the passive circuit 20, the passive circuit 20 does not include any active elements. In this regard, the input signal INS is received via the passive circuit 20 and the output current IO is provided via the OTA 18. The input signal INS is high-pass filtered and integrated to provide the output current IO using the passive circuit 20 and the OTA 18.

In one embodiment of the combined filter and OTA 16, the OTA 18 is a single OTA. By combining high-pass filter, integrator, and transconductance functions using the single OTA, the combined filter and OTA 16 may operate with a higher bandwidth than if multiple OTAs were used. As a result, for a given process technology, a bandwidth of the combined filter and OTA 16 may be maximized, thereby maximizing an allowable bandwidth of the input signal INS. The OTA 18 receives a positive-side input voltage VP at the non-inverting input to the OTA 18. Further, the OTA 18 receives a negative-side input voltage VN at the inverting input to the OTA 18. The OTA 18 provides the output current IO based on a voltage difference between the positive-side input voltage VP and the negative-side input voltage VN. Specifically, the voltage difference is equal to a magnitude of the positive-side input voltage VP minus a magnitude of the negative-side input voltage VN. In this regard, since the OTA 18 provides the output current IO based on the voltage difference, the OTA 18 functions as a transconductance amplifier. As such, a transconductance GM of the OTA 18 is equal to a magnitude of the output current IO divided by the voltage difference. Additionally, the OTA 18 receives a first DC source signal DC1 and a second DC source signal DC2 to provide power to the OTA 18.

Figure 3:
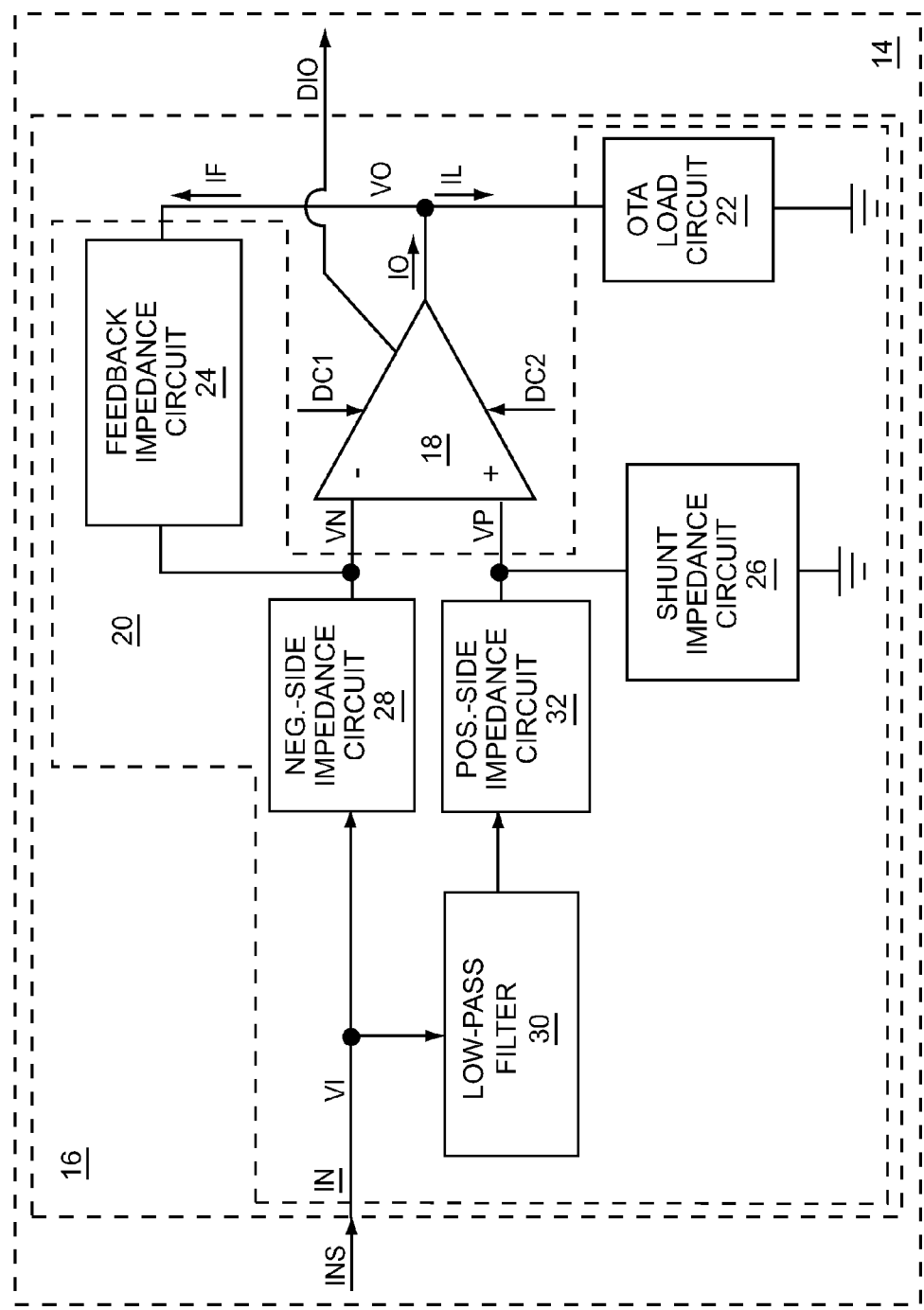
FIG. 3 shows details of a combined filter and OTA illustrated in FIG. 2 according to one embodiment of the combined filter and OTA.

FIG. 3 shows details of the combined filter and OTA 16 illustrated in FIG. 2 according to one embodiment of the combined filter and OTA 16. The combined filter and OTA 16 illustrated in FIG. 3 is similar to the combined filter and OTA 16 illustrated in FIG. 2, except the combined filter and OTA 16 illustrated in FIG. 3 shows details of the passive circuit 20. Specifically, the passive circuit 20 includes an OTA load circuit 22, a feedback impedance circuit 24, a shunt impedance circuit 26, a negative-side impedance circuit 28, a low-pass filter 30, and a positive-side impedance circuit 32. The OTA load circuit 22 is coupled between an output from the OTA 18 and a ground. The feedback impedance circuit 24 is coupled between the output from the OTA 18 and the inverting input to the OTA 18. The shunt impedance circuit 26 is coupled between the non-inverting input to the OTA 18 and the ground. The negative-side impedance circuit 28 is coupled between the inverting input to the OTA 18 and the input IN. A first end of the low-pass filter 30 is coupled to the input IN. The positive-side impedance circuit 32 is coupled between a second end of the low-pass filter 30 and the non-inverting input to the OTA 18.

The OTA load circuit 22 has a load impedance ZL. The OTA load circuit 22 receives a load current IL, such that an output voltage VO from the OTA 18 is developed across the OTA load circuit 22. In this regard, a magnitude of the output voltage VO is equal to the magnitude of the load current IL times a magnitude of the load impedance ZL. Since the OTA 18 is an operational amplifier, the OTA 18 may have very high input impedances and an open-circuit transconductance of the OTA 18 may be very high. Therefore, the OTA 18 may combine the functionality of an operational amplifier with transconductance characteristics. A magnitude of the output current IO is about equal to a sum of a magnitude of the load current IL and a magnitude of the feedback current IF. In one embodiment of the combined filter and OTA 16, the feedback current IF is much less than the load current IL. As such, the load current IL may be about equal to the output current IO. In this regard, the magnitude of the output voltage VO is about equal to a magnitude of the output current IO times the magnitude of the load impedance ZL. In one embodiment of the combined filter and OTA 16, a magnitude of the output current IO is at least ten times greater than a magnitude of the feedback current IF.

The feedback impedance circuit 24 has a feedback impedance ZF. The shunt impedance circuit 26 has a shunt impedance ZS. The negative-side impedance circuit 28 has a negative-side impedance ZN. The positive-side impedance circuit 32 has a positive-side impedance ZP. The input signal INS has an input voltage VI. During a first set of operating conditions, a frequency of the input signal INS is significantly less than a cutoff frequency of the low-pass filter 30. During a second set of operating conditions, the frequency of the input signal INS is significantly greater than the cutoff frequency of the low-pass filter 30. As such, during the first set of operating conditions, the low-pass filter 30 substantially passes the input signal INS to the positive-side impedance circuit 32. Further, during the first set of operating conditions, the low-pass filter 30 presents a low-pass filter resistance RLP between the input IN and the positive-side impedance circuit 32. During the second set of operating conditions, the low-pass filter 30 substantially blocks the input signal INS from the positive-side impedance circuit 32. Further, during the second set of operating conditions, the low-pass filter 30 presents approximately a short circuit to ground to the positive-side impedance circuit 32.

In one embodiment of the passive circuit 20, during the first set of operating conditions, a magnitude of the negative-side impedance ZN is about equal to a sum of a magnitude of the positive-side impedance ZP and a magnitude of the low-pass filter resistance RLP. Further, during the first set of operating conditions, a magnitude of the feedback impedance ZF is about equal to a magnitude of the shunt impedance ZS. The shunt impedance circuit 26, the low-pass filter 30, and the positive-side impedance circuit 32 form a positive-side voltage divider, such that the positive-side input voltage VP is equal to the input voltage VI divided down by the positive-side voltage divider. Further, the feedback impedance circuit 24 and the negative-side impedance circuit 28 form a negative-side voltage divider, such that the negative-side input voltage VN is equal to the input voltage VI divided down by the negative-side voltage divider.

During the first set of operating conditions, the negative-side voltage divider is about equal to the positive-side voltage divider. Further, since the OTA 18 drives the output current IO to make the negative-side input voltage VN about equal to the positive-side input voltage VP, a magnitude of the output voltage VO is driven to be about equal to ground. Therefore, during the first set of operating conditions, the input signal INS is blocked and the combined filter and OTA 16 behaves as a high-pass filter.

During the second set of operating conditions, since the low-pass filter 30 presents approximately a short circuit to ground to the positive-side impedance circuit 32, a magnitude of the positive-side input voltage VP is about equal to ground. Since the OTA 18 drives the output current IO to make the negative-side input voltage VN about equal to the positive-side input voltage VP, a magnitude of the output voltage VO is driven based on the input voltage VI and a gain determined by the feedback impedance ZF and the negative-side impedance ZN. Therefore, during the second set of operating conditions, the input signal INS is amplified and the combined filter and OTA 16 behaves as a high-pass filter. In general, the output current IO is further based on low-pass filtering the input signal INS. As such, in one embodiment of the combined filter and OTA 16, a cutoff frequency of the high-pass filter as provided by the combined filter and OTA 16 is equal to the cutoff frequency of the low-pass filter 30.

In one embodiment of the combined filter and OTA 16, during the second set of operating conditions, the frequency of the input signal INS is greater than the cutoff frequency of the high-pass filter as provided by the combined filter and OTA 16. In an alternate embodiment of the combined filter and OTA 16, during the second set of operating conditions, the frequency of the input signal INS is equal to at least two times the cutoff frequency of the high-pass filter as provided by the combined filter and OTA 16. In an additional embodiment of the combined filter and OTA 16, during the second set of operating conditions, the frequency of the input signal INS is equal to at least three times the cutoff frequency of the high-pass filter as provided by the combined filter and OTA 16. In another embodiment of the combined filter and OTA 16, during the second set of operating conditions, the frequency of the input signal INS is equal to at least five times the cutoff frequency of the high-pass filter as provided by the combined filter and OTA 16. In a further embodiment of the combined filter and OTA 16, during the second set of operating conditions, the frequency of the input signal INS is equal to at least ten times the cutoff frequency of the high-pass filter as provided by the combined filter and OTA 16. In an extra embodiment of the combined filter and OTA 16, during the second set of operating conditions, the frequency of the input signal INS is less than 100 times the cutoff frequency of the high-pass filter as provided by the combined filter and OTA 16.

In one embodiment of the combined filter and OTA 16, during the first set of operating conditions, the frequency of the input signal INS is less than the cutoff frequency of the high-pass filter as provided by the combined filter and OTA 16. In an alternate embodiment of the combined filter and OTA 16, during the first set of operating conditions, the frequency of the input signal INS is less than one-half the cutoff frequency of the high-pass filter as provided by the combined filter and OTA 16. In an additional embodiment of the combined filter and OTA 16, during the first set of operating conditions, the frequency of the input signal INS is less than one-tenth the cutoff frequency of the high-pass filter as provided by the combined filter and OTA 16.

In one embodiment of the combined filter and OTA 16, the high-pass filter as provided by the combined filter and OTA 16 is a single-pole filter. In an alternate embodiment of the combined filter and OTA 16, the high-pass filter as provided by the combined filter and OTA 16 is a two-pole filter. In an additional embodiment of the combined filter and OTA 16, the high-pass filter as provided by the combined filter and OTA 16 is a three-pole filter. In another embodiment of the combined filter and OTA 16, the high-pass filter as provided by the combined filter and OTA 16 is a four-pole filter. In a further embodiment of the combined filter and OTA 16, the high-pass filter as provided by the combined filter and OTA 16 is a five-pole filter.

In one embodiment of the low-pass filter 30, the low-pass filter 30 is a single-pole filter. In an alternate embodiment of the low-pass filter 30, the low-pass filter 30 is a two-pole filter. In an additional embodiment of the low-pass filter 30, the low-pass filter 30 is a three-pole filter. In another embodiment of the low-pass filter 30, the low-pass filter 30 is a four-pole filter. In a further embodiment of the low-pass filter 30, the low-pass filter 30 is a five-pole filter.

In one embodiment of the combined filter and OTA 16, the cutoff frequency of the high-pass filter as provided by the combined filter and OTA 16 is greater than one megahertz. In an alternate embodiment of the combined filter and OTA 16, the cutoff frequency of the high-pass filter as provided by the combined filter and OTA 16 is greater than two megahertz. In an additional embodiment of the combined filter and OTA 16, the cutoff frequency of the high-pass filter as provided by the combined filter and OTA 16 is greater than five megahertz. In another embodiment of the combined filter and OTA 16, the cutoff frequency of the high-pass filter as provided by the combined filter and OTA 16 is greater than ten megahertz. In a further embodiment of the combined filter and OTA 16, the cutoff frequency of the high-pass filter as provided by the combined filter and OTA 16 is greater than fifty megahertz. In an exemplary embodiment of the combined filter and OTA 16, the cutoff frequency of the high-pass filter as provided by the combined filter and OTA 16 is equal to about six megahertz. In another exemplary embodiment of the combined filter and OTA 16, the cutoff frequency of the high-pass filter as provided by the combined filter and OTA 16 is equal to about sixty megahertz.

In one embodiment of the OTA 18, the OTA 18 provides a derived output current DIO. The derived output current DIO is based on the output current IO, such that the derived output current DIO is representative of the output current IO. In one embodiment of the derived output current DIO, the derived output current DIO is about proportional to the output current IO. In one embodiment of the derived output current DIO, the derived output current DIO is based on a mirror current of the output current IO. In one embodiment of the derived output current DIO, a magnitude of the derived output current DIO is about equal to a first current scaling factor times a magnitude of the output current IO. In one embodiment of the OTA 18, the derived output current DIO is programmable. As such, in one embodiment of the OTA 18, the first current scaling factor is programmable. In this regard, in one embodiment of the OTA 18, a magnitude of the derived output current DIO is programmable.

Figure 4:
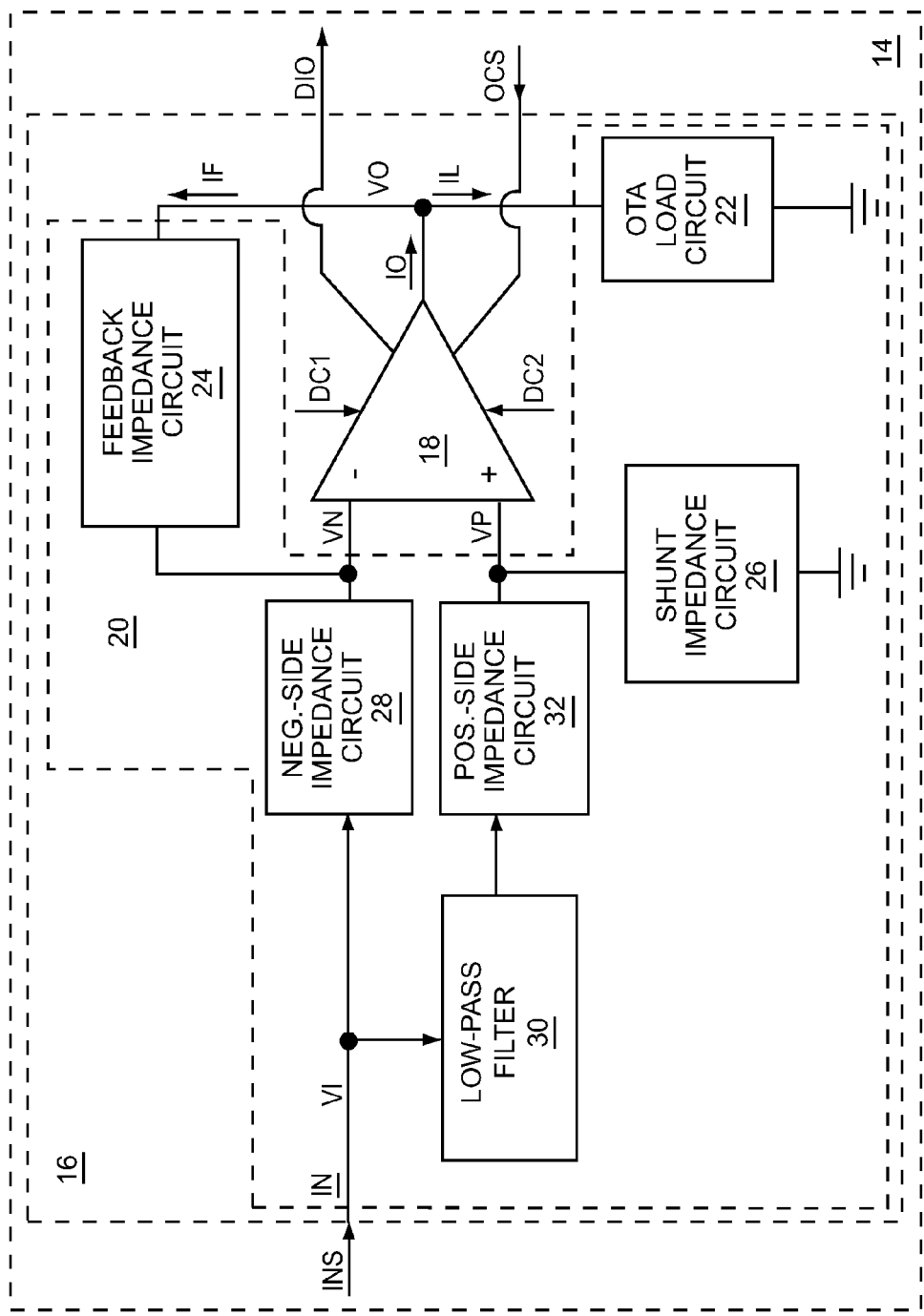
FIG. 4 shows details of the combined filter and OTA illustrated in FIG. 2 according to an alternate embodiment of the combined filter and OTA.

FIG. 4 shows details of the combined filter and OTA 16 illustrated in FIG. 2 according to an alternate embodiment of the combined filter and OTA 16. The combined filter and OTA 16 illustrated in FIG. 4 is similar to the combined filter and OTA 16 illustrated in FIG. 3, except in the combined filter and OTA 16 illustrated in FIG. 4, the OTA 18 further receives an OTA configuration signal OCS. In one embodiment of the OTA 18, the derived output current DIO is programmable, such that the derived output current DIO is based on the output current IO and the OTA configuration signal OCS. In one embodiment of the derived output current DIO, the magnitude of the derived output current DIO is about equal to the first current scaling factor times a magnitude of the output current IO, such that the first current scaling factor is based on the OTA configuration signal OCS.

Figure 5:
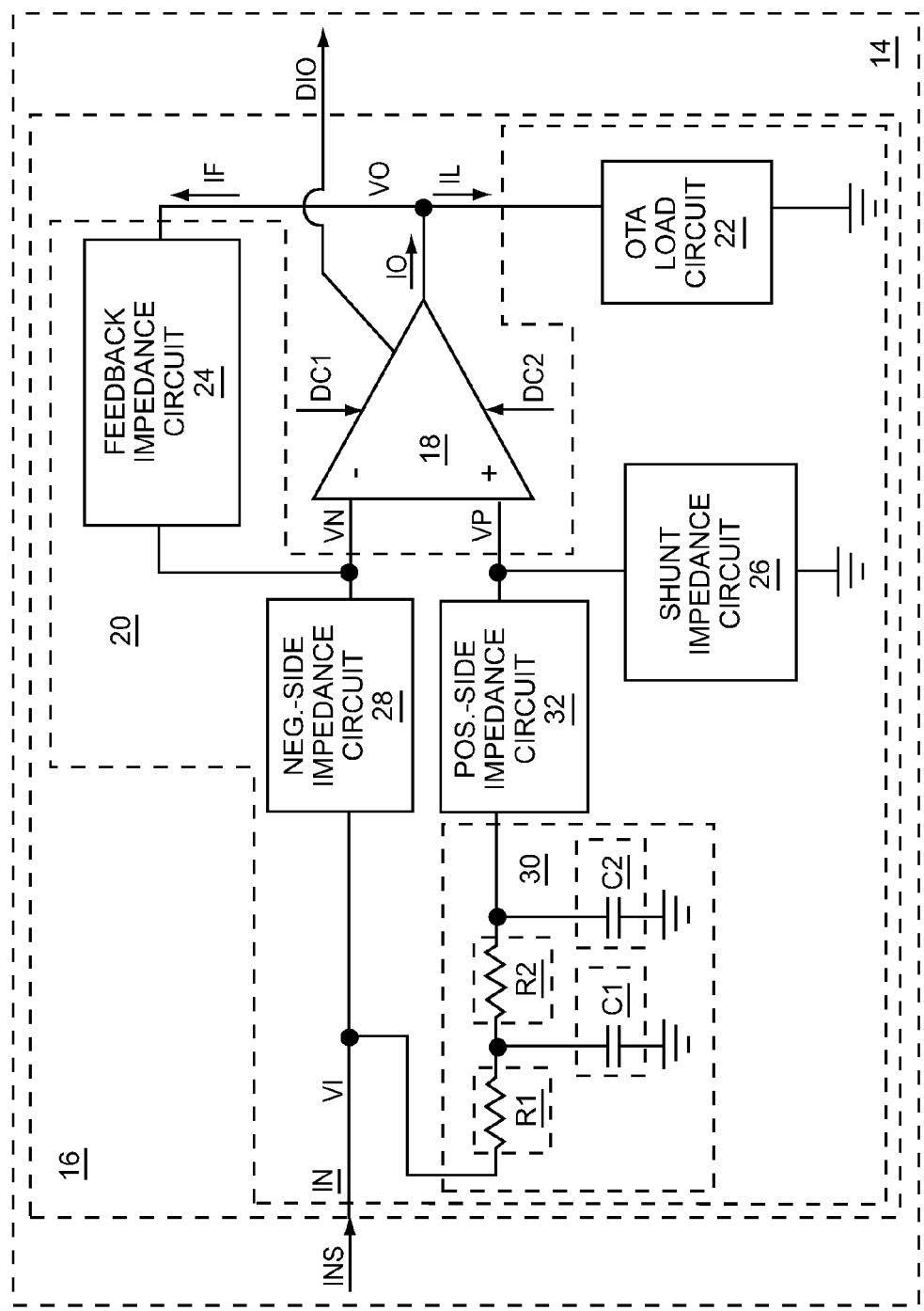
FIG. 5 shows details of the combined filter and OTA illustrated in FIG. 2 according to an additional embodiment of the combined filter and OTA.

FIG. 5 shows details of the combined filter and OTA 16 illustrated in FIG. 2 according to an additional embodiment of the combined filter and OTA 16. The combined filter and OTA 16 illustrated in FIG. 5 is similar to the combined filter and OTA 16 illustrated in FIG. 3, except the combined filter and OTA 16 illustrated in FIG. 5 shows details of the low-pass filter 30 illustrated in FIG. 3. The low-pass filter 30 includes a first resistive element R1, a second resistive element R2, a first capacitive element C1, and a second capacitive element C2. The first resistive element R1 is coupled between the input IN and a first end of the first capacitive element C1. The second resistive element R2 is coupled between the first end of the first capacitive element C1 and a first end of the second capacitive element C2. A second end of the first capacitive element C1 is coupled to the ground. A second end of the second capacitive element C2 is coupled to the ground. The first end of the second capacitive element C2 is further coupled to the positive-side impedance circuit 32. In this regard, the first resistive element R1, the second resistive element R2, the first capacitive element C1, and the second capacitive element C2 form a two-pole low-pass filter. Alternate embodiments of the low-pass filter 30 may have any number of poles.

Figure 6:
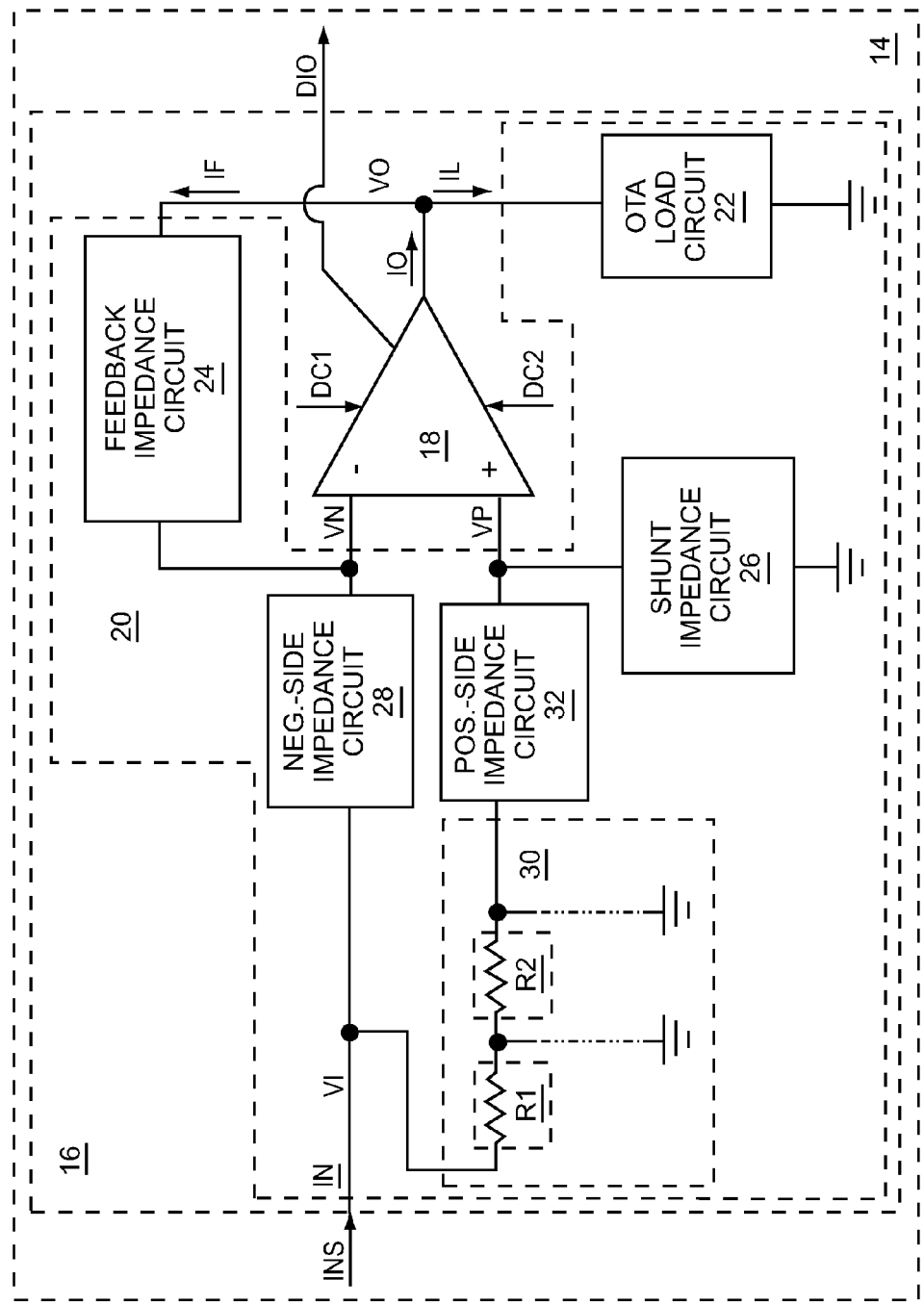
FIG. 6 shows details of the combined filter and OTA illustrated in FIG. 5 operating under a first set of operating conditions according to one embodiment of the combined filter and OTA.

FIG. 6 shows details of the combined filter and OTA 16 illustrated in FIG. 5 operating under the first set of operating conditions according to one embodiment of the combined filter and OTA 16. A gain G of the combined filter and OTA 16 is equal to a magnitude of the output voltage VO divided by a magnitude of the input voltage VI as shown in EQ. 1 below.

$$G=VO/VI.\qquad\text{EQ. 1:}$$

However, the output voltage VO is based on the positive-side input voltage VP and the negative-side input voltage VN, which are both based on the input voltage VI, the passive circuit 20, and feeding back the output voltage VO. During the first set of operating conditions, the frequency of the input signal INS is significantly less than the cutoff frequency of the low-pass filter 30. As such, the frequency of the input signal INS is significantly less than the cutoff frequency of the high-pass filter as provided by the combined filter and OTA 16. Therefore, the first capacitive element C1 and the second capacitive element C2 may substantially behave as open circuits as shown. As such, the impedance of the low-pass filter 30 is about equal to the combined series resistance of the first resistive element R1 and the second resistive element R2. This series resistance is represented as 2R.

In this regard, the first resistive element R1, the second resistive element R2, the positive-side impedance circuit 32, and the shunt impedance circuit 26 form a voltage divider between the input IN and the ground to feed the non-inverting input to the OTA 18. In one embodiment of the OTA 18, the OTA has very high input impedances and an open-circuit transconductance of the OTA 18 is very high. As such, the OTA 18 drives the output voltage VO to make the negative-side input voltage VN about equal to the positive-side input voltage VP, as shown in EQ. 2 below. Further, the voltage divider is based on the series resistance 2R, the positive-side impedance ZP, and the shunt impedance ZS as shown in EQ. 3 below.

$$VN=VP.\qquad\text{EQ. 2:}$$

$$VP=VI(ZS/(ZS+ZP+2R)).\qquad\text{EQ. 3:}$$

Further, the feedback current IF flows through both the feedback impedance circuit 24 and the negative-side impedance circuit 28. However, if the negative-side impedance ZN is about equal to a sum of the series resistance 2R and the positive-side impedance ZP, as shown in EQ. 4 below, then a magnitude of the feedback current IF is about equal to a magnitude of the current flowing through the positive-side impedance circuit 32 and is about equal to a magnitude of the current flowing through the shunt impedance circuit 26. Additionally, if the feedback impedance ZF is about equal to the shunt impedance ZS, as shown in EQ. 5 below, then the voltage drop across the feedback impedance circuit 24 is about equal to the voltage drop across the shunt impedance circuit 26, as shown in EQ. 6 below.

$$ZN=ZP+2R.\qquad\text{EQ. 4:}$$

$$ZF=ZS.\qquad\text{EQ. 5:}$$

$$(VP-0)=(VN-VO)\qquad\text{EQ. 6:}$$

However, substituting EQ. 2 into EQ. 6 and then solving for the output voltage VO indicates that the output voltage VO is equal to zero, as shown in EQ. 7 below.

$$(VN-0)=(VN-VO),\text{ therefore, }VO=0.\qquad\text{EQ. 7:}$$

Finally, substituting EQ. 7 into EQ. 1 indicates that the gain G of the combined filter and OTA 16 is equal to zero when the frequency of the input signal INS is significantly less than the cutoff frequency of the high-pass filter as provided by the combined filter and OTA 16, as shown in EQ. 8 below.

$$G=VO/VI=0/VI=0.\qquad\text{EQ. 8:}$$

Therefore, during the first set of operating conditions, the input signal INS is blocked and the combined filter and OTA 16 behaves as a high-pass filter.

Figure 7:
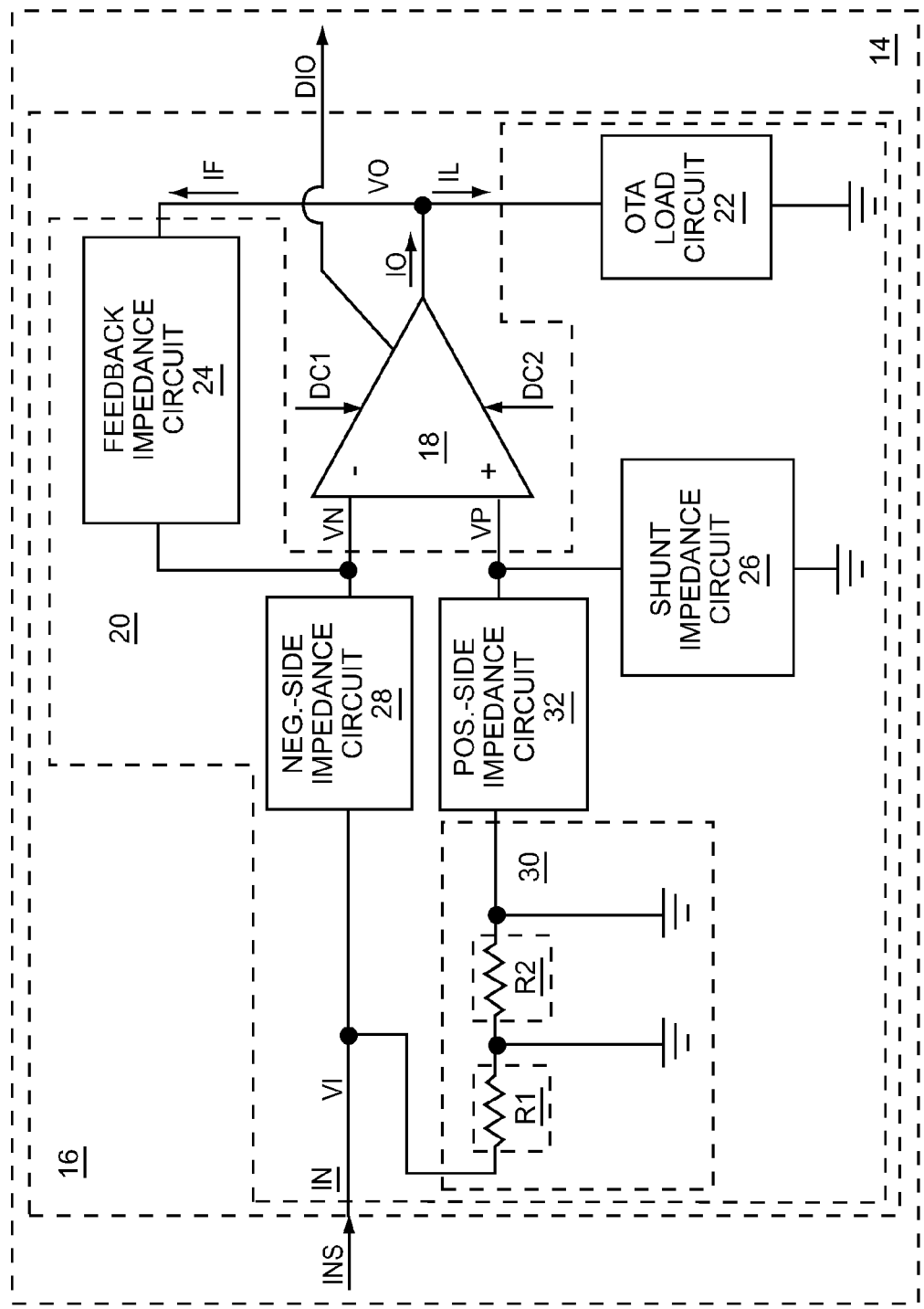
FIG. 7 shows details of the combined filter and OTA illustrated in FIG. 5 operating under a second set of operating conditions according to one embodiment of the combined filter and OTA.

FIG. 7 shows details of the combined filter and OTA 16 illustrated in FIG. 5 operating under the second set of operating conditions according to one embodiment of combined filter and OTA 16. During the second set of operating conditions, the frequency of the input signal INS is significantly greater than the cutoff frequency of the low-pass filter 30. As such, the frequency of the input signal INS is significantly greater than the cutoff frequency of the high-pass filter as provided by the combined filter and OTA 16. Therefore, the first capacitive element C1 and the second capacitive element C2 may substantially behave as short circuits as shown. As such, the impedance of the low-pass filter 30 presented to the positive-side impedance circuit 32 is equal to about zero and shorted to ground, as shown. Therefore, the positive-side input voltage VP is about equal to ground. Since the negative-side input voltage VN is about equal to the positive-side input voltage VP, as shown in EQ. 2, the negative-side input voltage VN is about equal to ground.

Therefore, since the feedback current IF flows through both the feedback impedance circuit 24 and the negative-side impedance circuit 28, and since the OTA 18 drives the output voltage VO to make the negative-side input voltage VN about equal to the positive-side input voltage VP, the input voltage VI is across the negative-side impedance circuit 28 and the output voltage VO is across the feedback impedance circuit 24, as shown in EQ. 9 below.

$$VI/ZN=-VO/ZF.\qquad\text{EQ. 9:}$$

Substituting EQ. 9 into EQ. 1 indicates that the gain G of the combined filter and OTA 16 is equal to a negative ratio of a magnitude of the feedback impedance ZF divided by a magnitude of the negative-side impedance ZN when the frequency of the input signal INS is significantly greater than the cutoff frequency of the high-pass filter as provided by the combined filter and OTA 16, as shown in EQ. 10 below. Since the gain G is negative, the output voltage VO is phase-shifted from the input voltage VI by about 180 degrees.

$$G = VO/VI = -ZF/ZN. \quad \text{EQ. 10:}$$

Therefore, during the second set of operating conditions, the input signal INS is allowed to pass and the combined filter and OTA 16 again behaves as a high-pass filter.

Figure 8:
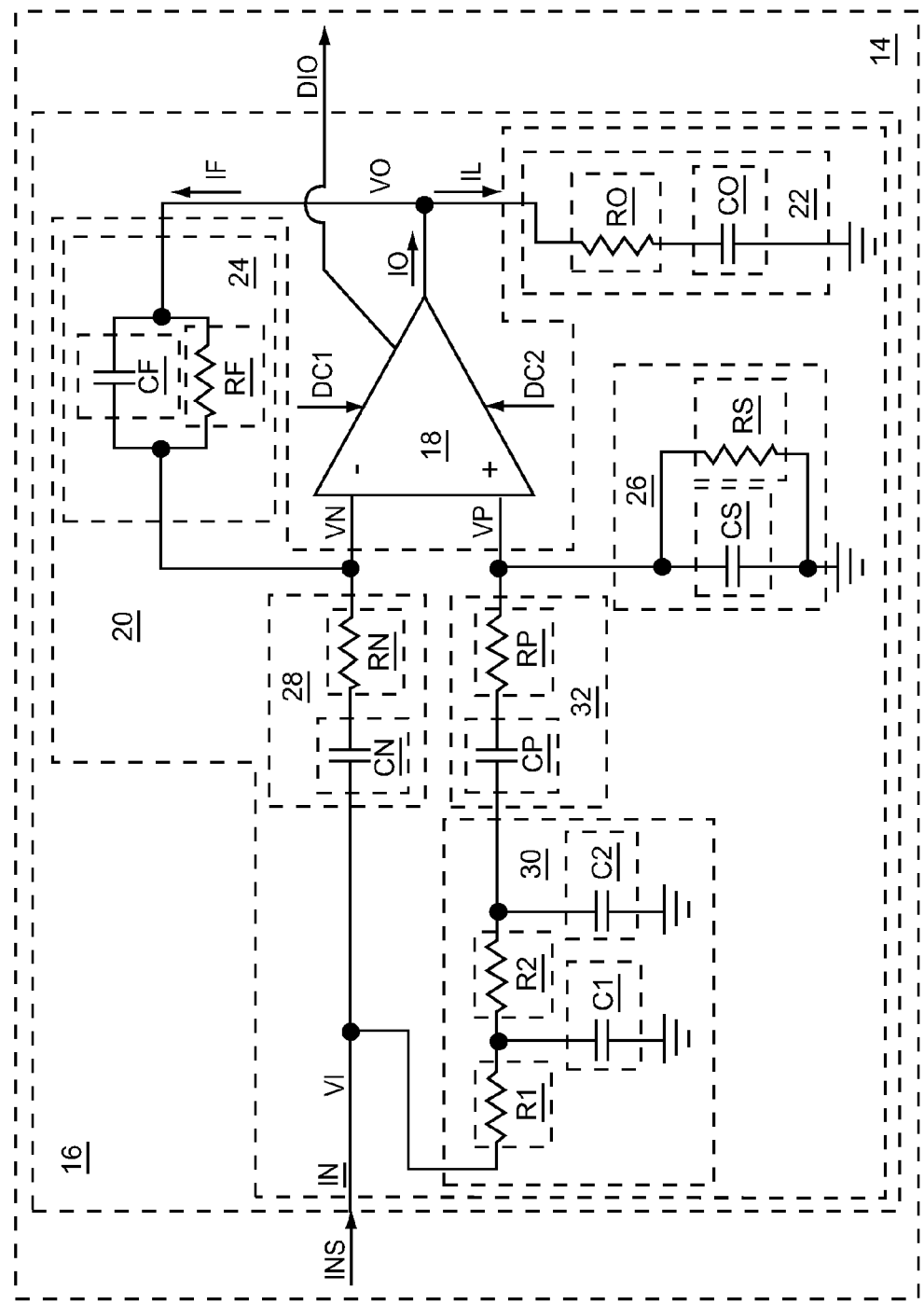
FIG. 8 shows details of the combined filter and OTA illustrated in FIG. 2 according to a further embodiment of the combined filter and OTA.

FIG. 8 shows details of the combined filter and OTA 16 illustrated in FIG. 2 according to a further embodiment of the combined filter and OTA 16. The combined filter and OTA 16 illustrated in FIG. 8 is similar to the combined filter and OTA 16 illustrated in FIG. 5, except the combined filter and OTA 16 illustrated in FIG. 8 shows details of the OTA load circuit 22, the feedback impedance circuit 24, the shunt impedance circuit 26, the negative-side impedance circuit 28, and the positive-side impedance circuit 32. Specifically, the OTA load circuit 22 includes a load capacitive element CO and a load resistive element RO. The feedback impedance circuit 24 includes a feedback capacitive element CF and a feedback resistive element RF. The shunt impedance circuit 26 includes a shunt capacitive element CS and a shunt resistive element RS. The negative-side impedance circuit 28 includes a negative-side capacitive element CN and a negative-side resistive element RN. The positive-side impedance circuit 32 includes a positive-side capacitive element CP and a positive-side resistive element RP.

The load capacitive element CO and the load resistive element RO are coupled in series between the output from the OTA 18 and the ground. The feedback capacitive element CF and the feedback resistive element RF are coupled in parallel with one another. As such, the feedback capacitive element CF is coupled between the output from the OTA 18 and the inverting input to the OTA 18, and the feedback resistive element RF is coupled between the output from the OTA 18 and the inverting input to the OTA 18. The shunt capacitive element CS and the shunt resistive element RS are coupled in parallel with one another. As such, the shunt capacitive element CS is coupled between the non-inverting input to the OTA 18 and the ground, and the shunt resistive element RS is coupled between the non-inverting input to the OTA 18 and the ground.

In one embodiment of the combined filter and OTA 16, during the first set of operating conditions, a magnitude of the feedback impedance ZF is about equal to a magnitude of the shunt impedance ZS. Therefore, during the first set of operating conditions, a resistance of the feedback resistive element RF is about equal to a resistance of the shunt resistive element RS. Further, a capacitance of the feedback capacitive element CF is about equal to a capacitance of the shunt capacitive element CS.

The negative-side capacitive element CN and the negative-side resistive element RN are coupled in series between the inverting input to the OTA 18 and the input IN. The positive-side capacitive element CP and the positive-side resistive element RP are coupled in series between the first end of the second capacitive element C2 and the non-inverting input to the OTA 18. In one embodiment of the combined filter and OTA 16, during the first set of operating conditions, a magnitude of the negative-side impedance ZN is about equal to a sum of a magnitude of the positive-side impedance ZP and a magnitude of the low-pass filter resistance RLP. Therefore, during the first set of operating conditions, a resistance of the negative-side resistive element RN is about equal to a sum of a resistance of the positive-side resistive element RP, a resistance of the first resistive element R1, and a resistance of the second resistive element R2. Further, during the first set of operating conditions, a capacitance of the negative-side capacitive element CN is about equal to a capacitance of the positive-side capacitive element CP.

In one embodiment of the combined filter and OTA 16, during the second set of operating conditions, the combined filter and OTA 16 behaves as a combined high-pass filter and integrator. In this regard, in one embodiment of the feedback impedance circuit 24 and the negative-side impedance circuit 28, during the second set of operating conditions, a resistance of the feedback resistive element RF is significantly larger than a capacitive reactance of the feedback capacitive element CF, a resistance of the negative-side resistive element RN is significantly larger than a capacitive reactance of the negative-side capacitive element CN, a resistance of the load resistive element RO is significantly larger than a capacitive reactance of the load capacitive element CO, and the capacitive reactance of the feedback capacitive element CF is significantly larger than the resistance of the load resistive element RO.

Therefore, the negative-side impedance ZN is mainly resistive, the feedback impedance ZF is mainly capacitive, the load impedance ZL is mainly resistive, and the feedback current IF is significantly less than the output current 10. Since the negative-side impedance ZN is mainly resistive and the feedback impedance ZF is mainly capacitive, the output voltage VO is approximately an integral of the input voltage VI. Further, since the feedback current IF is significantly less than the output current IO and since the load impedance ZL is mainly resistive, the output voltage VO and the output current IO are substantially phase-aligned. Therefore, the output current IO is an integral of the input voltage VI. Thus, the combined filter and OTA 16 behaves as a combined high-pass filter and integrator.

Figure 9:
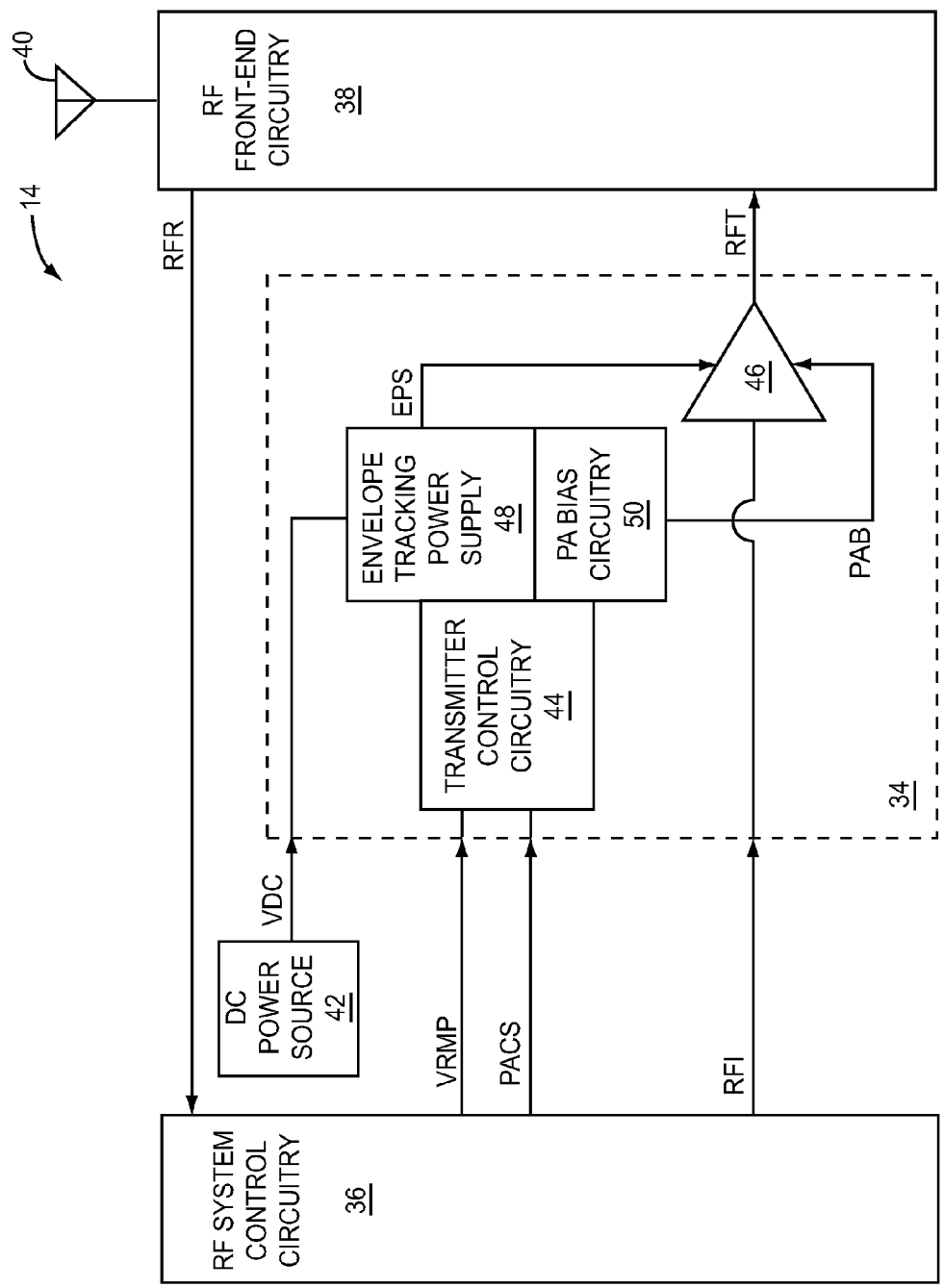
FIG. 9 shows the circuitry according to one embodiment of the circuitry.

FIG. 9 shows the circuitry 14 according to one embodiment of the circuitry 14. The circuitry 14 further includes radio frequency (RF) transmitter circuitry 34, RF system control circuitry 36, RF front-end circuitry 38, an RF antenna 40, and a DC power source 42. The RF transmitter circuitry 34 includes transmitter control circuitry 44, an RF power amplifier (PA) 46, an envelope tracking power supply 48, and PA bias circuitry 50. The envelope tracking power supply 48 includes the combined filter and OTA 16 (FIG. 2). In this regard, in one embodiment of the circuitry 14, the circuitry 14 illustrated in FIG. 9 is an RF communications system.

In one embodiment of the circuitry 14, the RF front-end circuitry 38 receives via the RF antenna 40, processes, and forwards an RF receive signal RFR to the RF system control circuitry 36. The RF system control circuitry 36 provides an envelope power supply control signal VRMP and a transmitter configuration signal PACS to the transmitter control circuitry 44. The RF system control circuitry 36 provides an RF input signal RFI to the RF PA 46. The DC power source 42 provides a DC source signal VDC to the envelope tracking power supply 48. In one embodiment of the DC power source 42, the DC power source 42 is a battery.

The transmitter control circuitry 44 is coupled to the envelope tracking power supply 48 and to the PA bias circuitry 50. The envelope tracking power supply 48 provides an envelope power supply signal EPS to the RF PA 46 based on the envelope power supply control signal VRMP. The DC source signal VDC provides power to the envelope tracking power supply 48. As such, the envelope power supply signal EPS is based on the DC source signal VDC. The envelope power supply control signal VRMP is representative of a setpoint of the envelope power supply signal EPS. The RF PA 46 receives and amplifies the RF input signal RFI to provide an RF transmit signal RFT using the envelope power supply signal EPS. The envelope power supply signal EPS provides power for amplification. The RF front-end circuitry 38 receives, processes, and transmits the RF transmit signal RFT via the RF antenna 40. In one embodiment of the RF transmitter circuitry 34, the transmitter control circuitry 44 configures the RF transmitter circuitry 34 based on the transmitter configuration signal PACS.

The PA bias circuitry 50 provides a PA bias signal PAB to the RF PA 46. In this regard, the PA bias circuitry 50 biases the RF PA 46 via the PA bias signal PAB. In one embodiment of the PA bias circuitry 50, the PA bias circuitry 50 biases the RF PA 46 based on the transmitter configuration signal PACS. In one embodiment of the RF front-end circuitry 38, the RF front-end circuitry 38 includes at least one RF switch, at least one RF amplifier, at least one RF filter, at least one RF duplexer, at least one RF diplexer, at least one RF amplifier, the like, or any combination thereof. In one embodiment of the RF system control circuitry 36, the RF system control circuitry 36 is RF transceiver circuitry, which may include an RF transceiver IC, baseband controller circuitry, the like, or any combination thereof. In one embodiment of the RF transmitter circuitry 34, the envelope tracking power supply 48 provides the envelope power supply signal EPS, which has switching ripple. In one embodiment of the RF transmitter circuitry 34, the envelope power supply signal EPS provides power for amplification and envelope tracks the RF transmit signal RFT.

Figure 10:
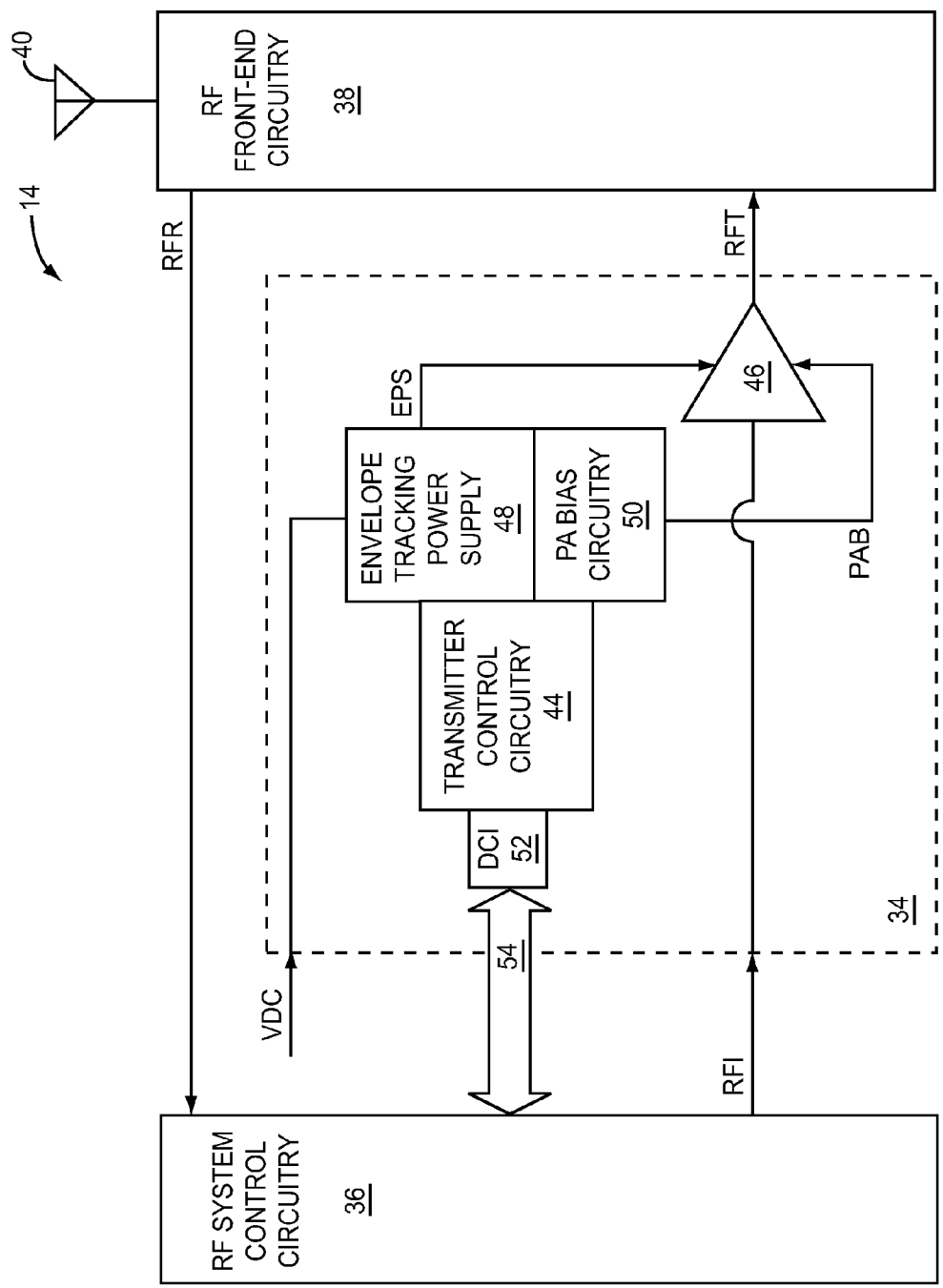
FIG. 10 shows the circuitry according to an alternate embodiment of the circuitry.

FIG. 10 shows the circuitry 14 according to an alternate embodiment of the circuitry 14. The circuitry 14 illustrated in FIG. 10 is similar to the circuitry 14 illustrated in FIG. 9, except in the circuitry 14 illustrated in FIG. 10, the RF transmitter circuitry 34 further includes a digital communications interface 52, which is coupled between the transmitter control circuitry 44 and a digital communications bus 54. The digital communications bus 54 is also coupled to the RF system control circuitry 36. As such, the RF system control circuitry 36 provides the envelope power supply control signal VRMP (FIG. 9) and the transmitter configuration signal PACS (FIG. 9) to the transmitter control circuitry 44 via the digital communications bus 54 and the digital communications interface 52.

Figure 11:
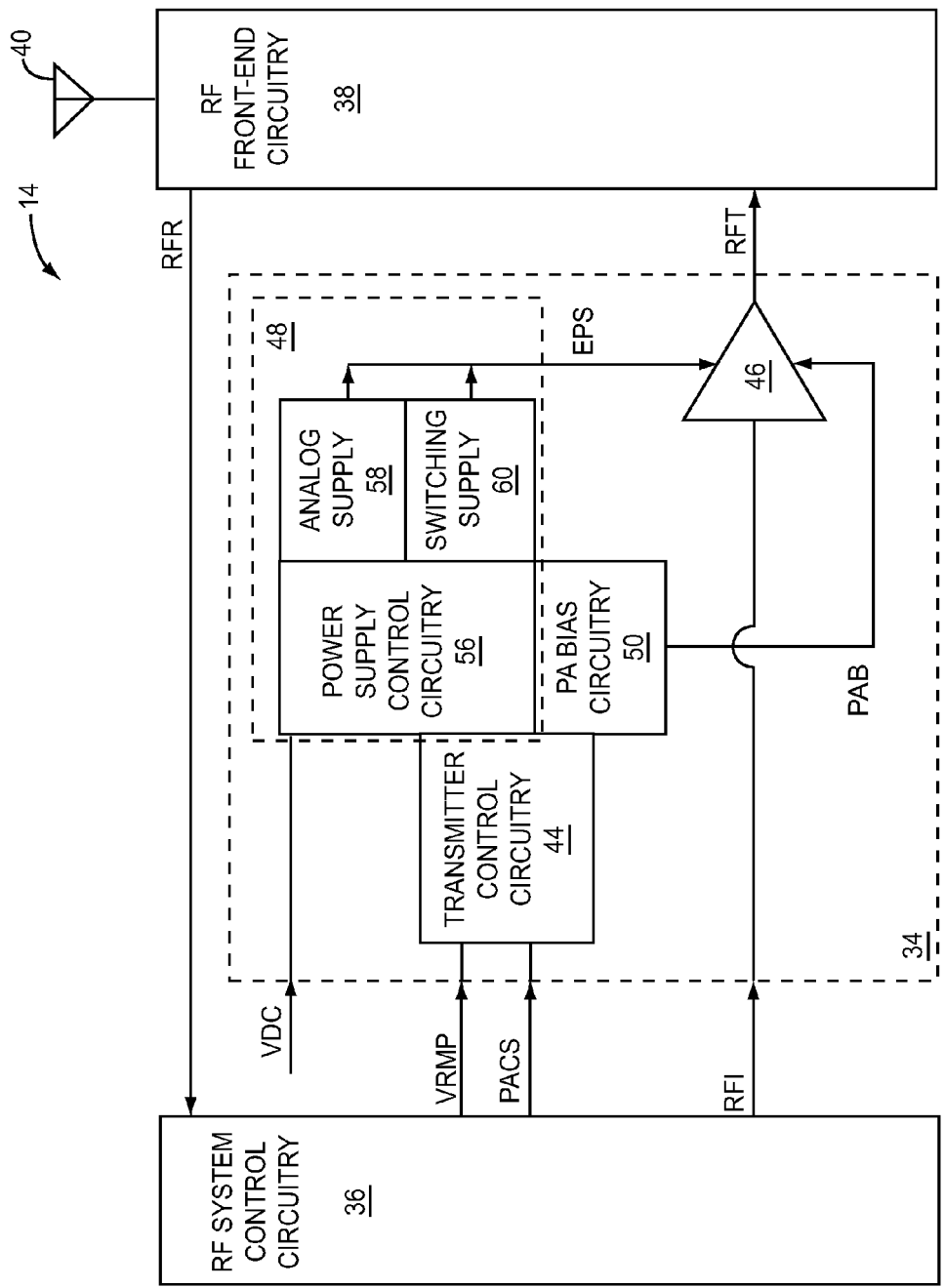
FIG. 11 shows details of an envelope tracking power supply illustrated in FIG. 9 according to one embodiment of the envelope tracking power supply.

FIG. 11 shows details of the envelope tracking power supply 48 illustrated in FIG. 9 according to one embodiment of the envelope tracking power supply 48. The envelope tracking power supply 48 includes power supply control circuitry 56, an analog supply 58, and a switching supply 60. The power supply control circuitry 56 controls the analog supply 58 and the switching supply 60. The analog supply 58 and the switching supply 60 provide the envelope power supply signal EPS, such that the analog supply 58 partially provides the envelope power supply signal EPS and the switching supply 60 partially provides the envelope power supply signal EPS. The switching supply 60 may provide power more efficiently than the analog supply 58. However, the analog supply 58 may provide the envelope power supply signal EPS more accurately than the switching supply 60. As such, the analog supply 58 regulates a voltage of the envelope power supply signal EPS based on the setpoint of the envelope power supply signal EPS, and the switching supply 60 operates to drive an output current from the analog supply 58 toward zero to maximize efficiency. In this regard, the analog supply 58 behaves like a voltage source and the switching supply 60 behaves like a current source.

Figure 12:
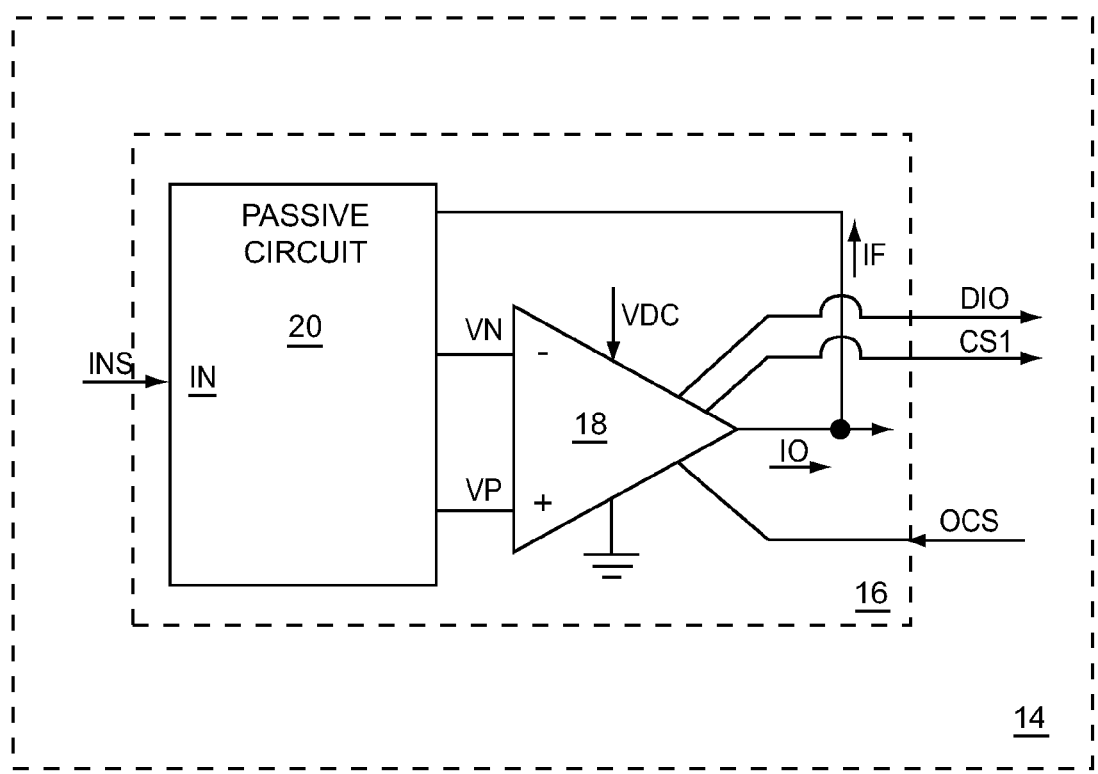
FIG. 12 shows details of the circuitry according to one embodiment of the circuitry.

FIG. 12 shows details of the circuitry 14 according to one embodiment of the circuitry 14. The circuitry 14 illustrated in FIG. 12 is similar to the circuitry 14 illustrated in FIG. 2, except in the circuitry 14 illustrated in FIG. 12, the OTA 18 further provide the derived output current DIO and a first current sense signal CS1, and receives the OTA configuration signal OCS. The first current sense signal CS1 is based on the derived output current DIO, such that the first current sense signal CS1 is representative of the derived output current DIO. In one embodiment of the first current sense signal CS1, the first current sense signal CS1 is about proportional to the derived output current DIO. In one embodiment of the first current sense signal CS1, the first current sense signal CS1 is based on a mirror current of the output current IO. In one embodiment of the first current sense signal CS1, a magnitude of the first current sense signal CS1 is about equal to a second current scaling factor times a magnitude of the derived output current DIO. In one embodiment of the OTA 18, the first current sense signal CS1 is programmable. As such, in one embodiment of the OTA 18, the second current scaling factor is programmable. In this regard, in one embodiment of the OTA 18, a magnitude of the first current sense signal CS1 is programmable. In one embodiment of the first current sense signal CS1, the first current sense signal CS1 is a voltage signal. In an alternate embodiment of the first current sense signal CS1, the first current sense signal CS1 is a current signal.

In one embodiment of the OTA 18, the derived output current DIO is programmable, such that the derived output current DIO is based on the output current IO and the OTA configuration signal OCS. In one embodiment of the derived output current DIO, the magnitude of the derived output current DIO is about equal to the first current scaling factor times a magnitude of the output current IO, such that the first current scaling factor is based on the OTA configuration signal OCS. In one embodiment of the OTA 18, the first current sense signal CS1 is programmable, such that the first current sense signal CS1 is based on the derived output current DIO and the OTA configuration signal OCS. In one embodiment of the first current sense signal CS1, the magnitude of the first current sense signal CS1 is about equal to the second current scaling factor times a magnitude of the derived output current DIO, such that the second current scaling factor is based on the OTA configuration signal OCS. In one embodiment of the OTA 18, both the first current scaling factor and the second current scaling factor are based on the OTA configuration signal OCS.

Figure 13:
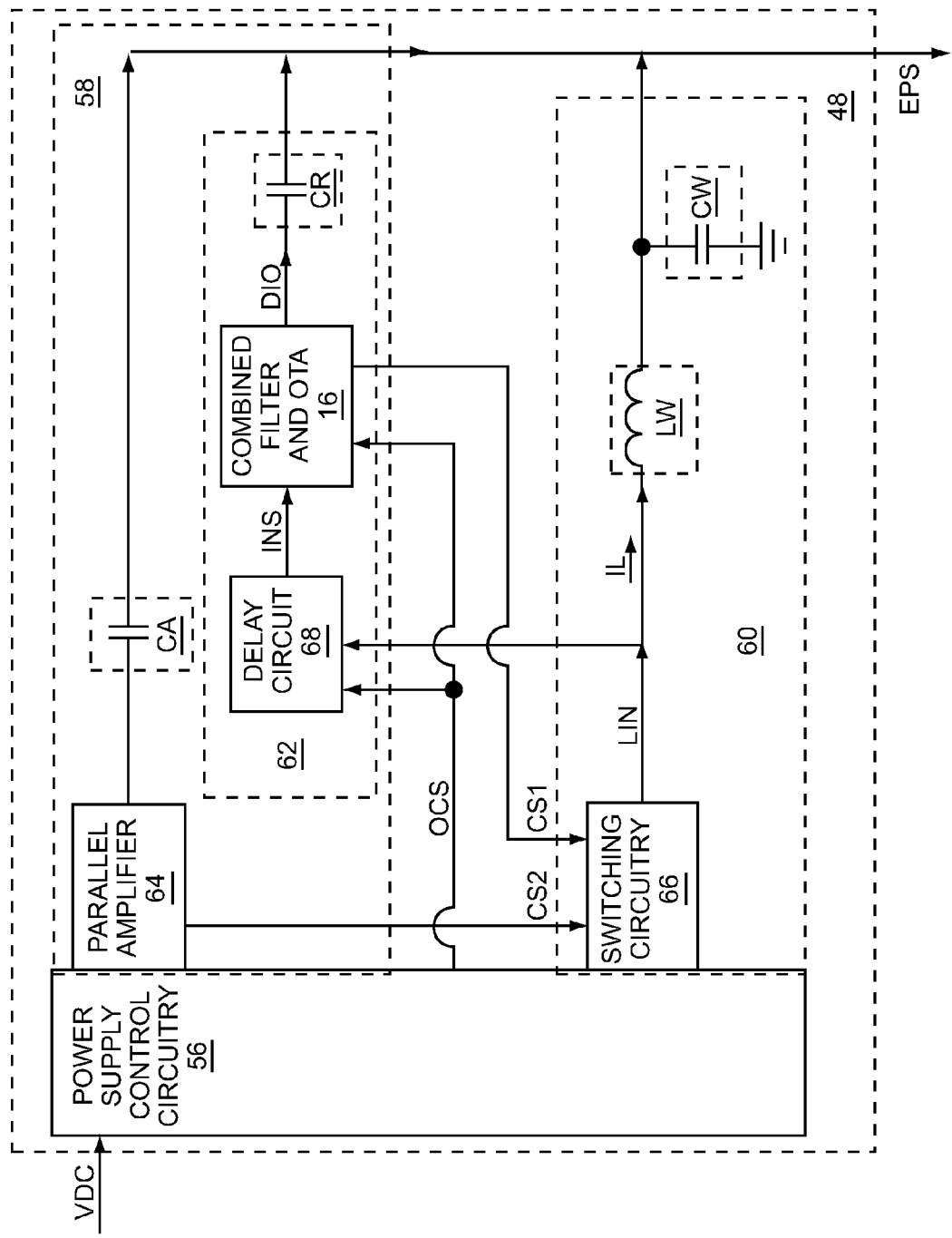
FIG. 13 shows details of the envelope tracking power supply illustrated in FIG. 11 according to one embodiment of the envelope tracking power supply.

FIG. 13 shows details of the envelope tracking power supply 48 illustrated in FIG. 11 according to one embodiment of the envelope tracking power supply 48. The envelope tracking power supply 48 includes the power supply control circuitry 56, the analog supply 58, and the switching supply 60. The analog supply 58 includes an active ripple cancellation circuit 62, a parallel amplifier 64, and a parallel amplifier offset capacitive element CA. The switching supply 60 includes switching circuitry 66, a switching supply inductive element LW, and a switching supply capacitive element CW. The active ripple cancellation circuit 62 includes a delay circuit 68, the combined filter and OTA 16, and a ripple circuit offset capacitive element CR. The power supply control circuitry 56 receives the DC source signal VDC.

The parallel amplifier 64 is coupled to the power supply control circuitry 56 and is powered via the DC source signal VDC. The parallel amplifier offset capacitive element CA is coupled between the parallel amplifier 64 and the RF PA 46 (FIG. 11). During operation, the parallel amplifier offset capacitive element CA may have an offset voltage. This offset voltage may allow the parallel amplifier 64 to function properly even if a voltage of the envelope power supply signal EPS is greater than a voltage of the DC source signal VDC. The parallel amplifier 64 provides a second current sense signal CS2 to the switching circuitry 66. The second current sense signal CS2 is indicative of an output current from the parallel amplifier 64. In an alternate embodiment of the analog supply 58, the parallel amplifier offset capacitive element CA is omitted.

The power supply control circuitry 56 controls the parallel amplifier 64 and the switching circuitry 66. The parallel amplifier 64 and the switching supply 60 provide the envelope power supply signal EPS, such that the parallel amplifier 64 partially provides the envelope power supply signal EPS and the switching supply 60 partially provides the envelope power supply signal EPS. The switching supply 60 may provide power more efficiently than the parallel amplifier 64. However, the parallel amplifier 64 may provide the envelope power supply signal EPS more accurately than the switching supply 60. As such, the parallel amplifier 64 regulates the voltage of the envelope power supply signal EPS based on the setpoint of the envelope power supply signal EPS. The switching supply 60 operates to drive the output current from the analog supply 58 toward zero to maximize efficiency based on the second current sense signal CS2. In this regard, the parallel amplifier 64 behaves like a voltage source and the switching supply 60 behaves like a current source.

The switching circuitry 66 is coupled to the power supply control circuitry 56 and is powered via the DC source signal VDC. The switching supply inductive element LW is coupled between the switching circuitry 66 and the RF PA 46 (FIG. 11). The switching supply capacitive element CW is coupled between the RF PA 46 (FIG. 11) and the ground. The switching circuitry 66 provides an inductor input signal LIN to the switching supply inductive element LW and to the delay circuit 68. The switching supply inductive element LW has an inductor current IL. The envelope power supply signal EPS is at least partially based on the inductor current IL. A voltage of the inductor input signal LIN is a square wave signal. A voltage of the envelope power supply signal EPS is fairly smooth due to filtering by the switching supply capacitive element CW and voltage regulation by the parallel amplifier 64. In one embodiment of the combined filter and OTA 16, the cutoff frequency of the high-pass filter as provided by the combined filter and OTA 16 is about equal to a frequency of the inductor input signal LIN.

During a peak of the square wave signal, the voltage of the inductor input signal LIN is positive with respect to the voltage of the envelope power supply signal EPS, thereby causing the inductor current IL to increase. Conversely, during a valley of the square wave signal, the voltage of the inductor input signal LIN is negative with respect to the voltage of the envelope power supply signal EPS, thereby causing the inductor current IL to decrease. As a result, a square wave voltage is developed across the switching supply inductive element LW. Due to integration by the switching supply inductive element LW, this square wave voltage produces a triangular wave ripple current in the inductor current IL. This ripple current is undesirable and may be problematic for proper operation of the RF PA 46 (FIG. 11).

As such, the active ripple cancellation circuit 62 at least partially cancels the triangular wave ripple current by providing the derived output current DIO, which is based on estimating the ripple current using the inductor input signal LIN. The derived output current DIO is an inverted estimated ripple current, which at least partially cancels the triangular wave ripple current in the inductor current IL.

Specifically, the delay circuit 68 is coupled between the switching circuitry 66 and the combined filter and OTA 16. The combined filter and OTA 16 is coupled between the delay circuit 68 and the ripple circuit offset capacitive element CR.

The ripple circuit offset capacitive element CR is coupled between the combined filter and OTA 16 and the RF PA 46 (FIG. 11). In one embodiment of the combined filter and OTA 16, the combined filter and OTA 16 is the combined filter and OTA 16 illustrated in FIG. 12. As such, the combined filter and OTA 16 is coupled to the power supply control circuitry 56 and is powered via the DC source signal VDC. During operation, the ripple circuit offset capacitive element CR may have an offset voltage. This offset voltage may allow the combined filter and OTA 16 to function properly even if a voltage of the envelope power supply signal EPS is greater than a voltage of the DC source signal VDC. In an alternate embodiment of the active ripple cancellation circuit 62, the ripple circuit offset capacitive element CR is omitted. In one embodiment of the active ripple cancellation circuit 62, the derived output current DIO is fed between the parallel amplifier 64 and the parallel amplifier offset capacitive element CA.

The delay circuit 68 receives and delays the inductor input signal LIN to provide the input signal INS. Delaying the inductor input signal LIN may be needed to properly time-align the inverted estimated ripple current with the triangular wave ripple current. In one embodiment of the power supply control circuitry 56, the power supply control circuitry 56 feeds the OTA configuration signal OCS to the delay circuit 68. The power supply control circuitry 56 controls the delay of the delay circuit 68 via the OTA configuration signal OCS. The delay may be adjusted based on the envelope power supply control signal VRMP (FIG. 9). In another embodiment of the active ripple cancellation circuit 62, the delay circuit 68 is fed with an alternate version of the inductor input signal LIN, such as a buffered version of the inductor input signal LIN. In an alternate embodiment of the active ripple cancellation circuit 62, the delay circuit 68 is omitted. To provide the inverted estimated ripple current via the derived output current DIO, the combined filter and OTA 16 must high-pass filter the input signal INS to process only frequencies of the triangular wave ripple current. Further, the combined filter and OTA 16 must integrate the input signal INS to convert the square wave input signal INS into a triangular wave. Finally, the combined filter and OTA 16 must invert the high-pass filtered and integrated input signal INS, as previously shown in EQ. 10, to provide the derived output current DIO, which is the inverted estimated ripple current.

The power supply control circuitry 56 provides the OTA configuration signal OCS to the combined filter and OTA 16. As such, the power supply control circuitry 56 may configure the combined filter and OTA 16 as needed via the OTA configuration signal OCS. The combined filter and OTA 16 provides the first current sense signal CS1 to the switching circuitry 66 based on the derived output current DIO. As such, in one embodiment of the switching supply 60, the switching supply 60 operates to drive the output current from the analog supply 58 toward zero to maximize efficiency based on both the first current sense signal CS1 and the second current sense signal CS2.

Some of the circuitry previously described may use discrete circuitry, integrated circuitry, programmable circuitry, non-volatile circuitry, volatile circuitry, software executing instructions on computing hardware, firmware executing instructions on computing hardware, the like, or any combination thereof. The computing hardware may include mainframes, micro-processors, micro-controllers, DSPs, the like, or any combination thereof.

None of the embodiments of the present disclosure are intended to limit the scope of any other embodiment of the present disclosure. Any or all of any embodiment of the present disclosure may be combined with any or all of any other embodiment of the present disclosure to create new embodiments of the present disclosure.

Those skilled in the art will recognize improvements and modifications to the embodiments of the present disclosure. All such improvements and modifications are considered within the scope of the concepts disclosed herein and the claims that follow.

What is claimed is:

1. Circuitry comprising:
    a passive circuit adapted to receive an input signal; and
    an operational transconductance amplifier (OTA) coupled to the passive circuit and adapted to provide an output current, such that:
        the passive circuit and the OTA provide a high-pass filter, which is configured to high-pass filter and integrate the input signal to provide the output current;
        the passive circuit comprises a feedback impedance circuit coupled between an output from the OTA and an inverting input to the OTA; and
        during a first set of operating conditions, the feedback impedance circuit has a feedback current, such that a magnitude of the output current is at least ten times greater than a magnitude of the feedback current.

2. The circuitry of claim 1 wherein the passive circuit does not comprise any active elements.

3. The circuitry of claim 1 wherein the OTA is a single OTA.

4. The circuitry of claim 1 wherein a cutoff frequency of the high-pass filter is greater than about one megahertz.

5. The circuitry of claim 1 wherein a cutoff frequency of the high-pass filter is equal to about six megahertz.

6. The circuitry of claim 1 wherein the high-pass filter is a two-pole filter.

7. The circuitry of claim 1 wherein the passive circuit comprises a low-pass filter, such that the output current is further based on low-pass filtering the input signal.

8. Circuitry comprising:
    a passive circuit adapted to receive an input signal; and
    an operational transconductance amplifier (OTA) coupled to the passive circuit and adapted to provide an output current, such that:
        the passive circuit and the OTA provide a high-pass filter, which is configured to high-pass filter and integrate the input signal to provide the output current;
        the passive circuit comprises a low-pass filter, such that the output current is further based on low-pass filtering the input signal; and
        a cutoff frequency of the high-pass filter is about equal to a cutoff frequency of the low-pass filter.

9. The circuitry of claim 1 wherein:
    the passive circuit further comprises a shunt impedance circuit coupled between a non-inverting input to the OTA and a ground;
    during the first set of operating conditions, the feedback impedance circuit has a feedback impedance and the shunt impedance circuit has a shunt impedance; and
    the feedback impedance is about equal to the shunt impedance.

10. The circuitry of claim 1 wherein the passive circuit further comprises a negative-side impedance circuit coupled between the inverting input to the OTA and an input, which is adapted to receive the input signal.

11. The circuitry of claim 1 wherein the OTA is further adapted to provide a derived output current that is representative of the output current.

12. The circuitry of claim 11 wherein a magnitude of the derived output current is programmable.

13. The circuitry of claim 11 wherein the OTA is further adapted to provide a current sense signal that is representative of the derived output current.

14. Circuitry comprising:
    an active ripple cancellation circuit and a switching supply inductive element;
    a passive circuit adapted to receive an input signal; and
    an operational transconductance amplifier (OTA) coupled to the passive circuit and adapted to provide an output current, such that:
        the passive circuit and the OTA high-pass filter and integrate the input signal to provide the output current;
        the OTA and the passive circuit provide a combined filter and OTA;
        the OTA is further adapted to provide a derived output current that is representative of the output current;
        the active ripple cancellation circuit comprises the combined filter and OTA;
        the switching supply inductive element has an inductor current having a ripple current; and
        the derived output current at least partially cancels the ripple current.

15. The circuitry of claim 14 further comprising a radio frequency (RF) power amplifier (PA) wherein:
    the RF PA is adapted to receive and amplify an RF input signal to provide an RF transmit signal using an envelope power supply signal; and
    the envelope power supply signal is at least partially based on the inductor current.

16. The circuitry of claim 14 further comprising switching circuitry wherein:
    the switching circuitry is adapted to provide an inductor input signal to the switching supply inductive element and the active ripple cancellation circuit; and
    the derived output current is based on the inductor input signal.

17. The circuitry of claim 16 wherein:
    the active ripple cancellation circuit further comprises a delay circuit coupled between the switching circuitry and the combined filter and OTA;
    the delay circuit is adapted to receive the inductor input signal; and
    the delay circuit is further adapted to provide the input signal based on delaying the inductor input signal.

* * * * *